(12) United States Patent
Colgrove et al.

(10) Patent No.: US 9,841,921 B2
(45) Date of Patent: Dec. 12, 2017

(54) MIGRATING DATA IN A STORAGE ARRAY THAT INCLUDES A PLURALITY OF STORAGE DEVICES

(71) Applicant: Pure Storage, Inc., Mountain View, CA (US)

(72) Inventors: John Colgrove, Los Altos, CA (US); Andrew Kleinerman, San Francisco, CA (US); Benjamin Scholbrock, Sunnyvale, CA (US); Taher Vohra, Sunnyvale, CA (US); Xiaohui Wang, San Jose, CA (US)

(73) Assignee: Pure Storage, Inc., Mountain View, CA (US)

( * ) Notice: Subject to any disclaimer, the term of this patent is extended or adjusted under 35 U.S.C. 154(b) by 0 days.

(21) Appl. No.: 15/140,445

(22) Filed: Apr. 27, 2016

(65) Prior Publication Data

US 2017/0315752 A1 Nov. 2, 2017

(51) Int. Cl.
G06F 3/06 (2006.01)
G11C 11/4096 (2006.01)
G11C 11/4074 (2006.01)

(52) U.S. Cl.
CPC ........... *G06F 3/0647* (2013.01); *G06F 3/067* (2013.01); *G06F 3/0607* (2013.01);
(Continued)

(58) Field of Classification Search
CPC .... G06F 3/0617; G06F 3/0646; G06F 3/0647; G06F 3/0683; G06F 3/0689
(Continued)

(56) References Cited

U.S. PATENT DOCUMENTS 5,706,210 A   1/1998 Kumano et al.
5,799,200 A   8/1998 Brant et al.
(Continued)

FOREIGN PATENT DOCUMENTS

EP        0725324 A2    8/1996
WO   WO-2012/087648 A1   6/2012
(Continued)

OTHER PUBLICATIONS

The International Search Report and the Written Opinoin received from the International Searching Authority (ISA/EPO) for International Application No. PCT/US2016/032052, dated Aug. 30, 2016, 17 pages.
(Continued)

*Primary Examiner* — Prasith Thammavong
(74) *Attorney, Agent, or Firm* — Edward J. Lenart; Kennedy Lenart Spraggins LLP

(57) ABSTRACT

Migrating data in a storage array that includes a plurality of storage devices, including: detecting, by the storage array, an occurrence of a storage device evacuation event associated with one or more source storage devices; responsive to detecting the occurrence of the storage device evacuation event, identifying, by the storage array, one or more target storage devices for receiving data stored on the one or more source storage devices; reducing, by the storage array, write access to the one or more source storage devices; and migrating the data stored on the one or more source storage devices to the one or more target storage devices.

14 Claims, 8 Drawing Sheets

(52) U.S. Cl.
CPC ........ G06F 3/0683 (2013.01); G11C 11/4074 (2013.01); G11C 11/4096 (2013.01)

(58) Field of Classification Search
USPC ................................................ 711/114, 103
See application file for complete search history.

(56) References Cited

U.S. PATENT DOCUMENTS

| | | | |
|---|---|---|---|
| 5,933,598 A | 8/1999 | Scales et al. | |
| 6,012,032 A | 1/2000 | Donovan et al. | |
| 6,085,333 A | 7/2000 | DeKoning et al. | |
| 6,643,641 B1 | 11/2003 | Snyder | |
| 6,647,514 B1* | 11/2003 | Umberger ........... G06F 11/1092 | |
| | | | 714/42 |
| 6,789,162 B1 | 9/2004 | Talagala et al. | |
| 7,089,272 B1 | 8/2006 | Garthwaite et al. | |
| 7,107,389 B2 | 9/2006 | Inagaki et al. | |
| 7,146,521 B1 | 12/2006 | Nguyen | |
| 7,334,124 B2 | 2/2008 | Pham et al. | |
| 7,437,530 B1 | 10/2008 | Rajan | |
| 7,493,424 B1 | 2/2009 | Bali et al. | |
| 7,669,029 B1 | 2/2010 | Mishra et al. | |
| 7,689,609 B2 | 3/2010 | Lango et al. | |
| 7,743,191 B1 | 6/2010 | Liao | |
| 7,899,780 B1 | 3/2011 | Shmuylovich et al. | |
| 8,042,163 B1 | 10/2011 | Karr et al. | |
| 8,086,585 B1 | 12/2011 | Brashers et al. | |
| 8,271,700 B1 | 9/2012 | Annem et al. | |
| 8,387,136 B2 | 2/2013 | Lee et al. | |
| 8,437,189 B1 | 5/2013 | Montierth et al. | |
| 8,465,332 B2 | 6/2013 | Hogan et al. | |
| 8,527,544 B1 | 9/2013 | Colgrove et al. | |
| 8,566,546 B1 | 10/2013 | Marshak et al. | |
| 8,578,442 B1 | 11/2013 | Banerjee | |
| 8,613,066 B1 | 12/2013 | Brezinski et al. | |
| 8,620,970 B2 | 12/2013 | English et al. | |
| 8,751,463 B1 | 6/2014 | Chamness | |
| 8,762,642 B2 | 6/2014 | Bates et al. | |
| 8,769,622 B2 | 7/2014 | Chang et al. | |
| 8,800,009 B1 | 8/2014 | Beda, III et al. | |
| 8,812,860 B1 | 8/2014 | Bray | |
| 8,850,546 B1 | 9/2014 | Field et al. | |
| 8,898,346 B1 | 11/2014 | Simmons | |
| 8,909,854 B2 | 12/2014 | Yamagishi et al. | |
| 8,931,041 B1 | 1/2015 | Banerjee | |
| 8,949,863 B1 | 2/2015 | Coatney et al. | |
| 8,984,602 B1 | 3/2015 | Bailey et al. | |
| 8,990,905 B1 | 3/2015 | Bailey et al. | |
| 9,124,569 B2 | 9/2015 | Hussain et al. | |
| 9,134,922 B2 | 9/2015 | Rajagopal et al. | |
| 9,209,973 B2 | 12/2015 | Aikas et al. | |
| 9,250,823 B1* | 2/2016 | Kamat ................. G06F 3/0647 | |
| 9,300,660 B1 | 3/2016 | Borowiec et al. | |
| 9,444,822 B1 | 9/2016 | Borowiec et al. | |
| 9,507,532 B1 | 11/2016 | Colgrove et al. | |
| 2002/0013802 A1 | 1/2002 | Mori et al. | |
| 2003/0145172 A1 | 7/2003 | Galbraith et al. | |
| 2003/0191783 A1 | 10/2003 | Wolczko et al. | |
| 2003/0225961 A1 | 12/2003 | Chow et al. | |
| 2004/0080985 A1 | 4/2004 | Chang et al. | |
| 2004/0111573 A1 | 6/2004 | Garthwaite | |
| 2004/0153844 A1 | 8/2004 | Ghose et al. | |
| 2004/0193814 A1 | 9/2004 | Erickson et al. | |
| 2004/0260967 A1* | 12/2004 | Guha ................... G06F 11/008 | |
| | | | 714/3 |
| 2005/0160416 A1 | 7/2005 | Jamison | |
| 2005/0188246 A1* | 8/2005 | Emberty ............... G06F 3/0607 | |
| | | | 714/5.11 |
| 2005/0216800 A1 | 9/2005 | Bicknell et al. | |
| 2006/0015771 A1* | 1/2006 | Van Gundy ......... G06F 11/2094 | |
| | | | 714/6.32 |
| 2006/0129817 A1 | 6/2006 | Borneman et al. | |
| 2006/0161726 A1 | 7/2006 | Lasser | |
| 2006/0230245 A1 | 10/2006 | Gounares et al. | |
| 2006/0239075 A1 | 10/2006 | Williams et al. | |
| 2007/0022227 A1 | 1/2007 | Miki | |
| 2007/0028068 A1 | 2/2007 | Golding et al. | |
| 2007/0055702 A1 | 3/2007 | Fridella et al. | |
| 2007/0109856 A1 | 5/2007 | Pellicone et al. | |
| 2007/0150689 A1 | 6/2007 | Pandit et al. | |
| 2007/0168321 A1 | 7/2007 | Saito et al. | |
| 2007/0220227 A1 | 9/2007 | Long | |
| 2007/0294563 A1 | 12/2007 | Bose | |
| 2007/0294564 A1 | 12/2007 | Reddin et al. | |
| 2008/0005587 A1 | 1/2008 | Ahlquist | |
| 2008/0077825 A1 | 3/2008 | Bello et al. | |
| 2008/0162674 A1 | 7/2008 | Dahiya | |
| 2008/0195833 A1 | 8/2008 | Park | |
| 2008/0270678 A1 | 10/2008 | Cornwell et al. | |
| 2008/0282045 A1 | 11/2008 | Biswas et al. | |
| 2009/0077340 A1 | 3/2009 | Johnson et al. | |
| 2009/0100115 A1 | 4/2009 | Park et al. | |
| 2009/0198889 A1 | 8/2009 | Ito et al. | |
| 2010/0052625 A1 | 3/2010 | Cagno et al. | |
| 2010/0211723 A1 | 8/2010 | Mukaida | |
| 2010/0246266 A1 | 9/2010 | Park et al. | |
| 2010/0257142 A1 | 10/2010 | Murphy et al. | |
| 2010/0262764 A1 | 10/2010 | Liu et al. | |
| 2010/0325345 A1 | 12/2010 | Ohno et al. | |
| 2010/0332754 A1 | 12/2010 | Lai et al. | |
| 2011/0072290 A1 | 3/2011 | Davis et al. | |
| 2011/0125955 A1 | 5/2011 | Chen | |
| 2011/0131231 A1 | 6/2011 | Haas et al. | |
| 2011/0167221 A1 | 7/2011 | Pangal et al. | |
| 2011/0246733 A1* | 10/2011 | Usgaonkar ........... G06F 3/0608 | |
| | | | 711/162 |
| 2012/0023144 A1 | 1/2012 | Rub | |
| 2012/0054264 A1 | 3/2012 | Haugh et al. | |
| 2012/0079318 A1 | 3/2012 | Colgrove et al. | |
| 2012/0131253 A1 | 5/2012 | McKnight et al. | |
| 2012/0303919 A1 | 11/2012 | Hu et al. | |
| 2012/0311000 A1 | 12/2012 | Post et al. | |
| 2013/0007845 A1 | 1/2013 | Chang et al. | |
| 2013/0031414 A1 | 1/2013 | Dhuse et al. | |
| 2013/0036272 A1 | 2/2013 | Nelson | |
| 2013/0071087 A1 | 3/2013 | Motiwala et al. | |
| 2013/0086006 A1* | 4/2013 | Colgrove ............. G06F 3/0688 | |
| | | | 707/692 |
| 2013/0145447 A1 | 6/2013 | Maron | |
| 2013/0191555 A1 | 7/2013 | Liu | |
| 2013/0198459 A1 | 8/2013 | Joshi et al. | |
| 2013/0205173 A1 | 8/2013 | Yoneda | |
| 2013/0219164 A1 | 8/2013 | Hamid | |
| 2013/0227201 A1 | 8/2013 | Talagala et al. | |
| 2013/0290607 A1 | 10/2013 | Chang et al. | |
| 2013/0311434 A1 | 11/2013 | Jones | |
| 2013/0318297 A1 | 11/2013 | Jibbe et al. | |
| 2013/0332614 A1 | 12/2013 | Brunk et al. | |
| 2014/0020083 A1 | 1/2014 | Fetik | |
| 2014/0032834 A1 | 1/2014 | Cudak et al. | |
| 2014/0074850 A1 | 3/2014 | Noel et al. | |
| 2014/0082715 A1 | 3/2014 | Grajek et al. | |
| 2014/0086146 A1 | 3/2014 | Kim et al. | |
| 2014/0090009 A1 | 3/2014 | Li et al. | |
| 2014/0096220 A1 | 4/2014 | Da Cruz Pinto et al. | |
| 2014/0101434 A1 | 4/2014 | Senthurpandi et al. | |
| 2014/0164774 A1 | 6/2014 | Nord et al. | |
| 2014/0173232 A1 | 6/2014 | Reohr et al. | |
| 2014/0195636 A1 | 7/2014 | Karve et al. | |
| 2014/0201512 A1 | 7/2014 | Seethaler et al. | |
| 2014/0201541 A1 | 7/2014 | Paul et al. | |
| 2014/0208155 A1* | 7/2014 | Pan ..................... G06F 11/2087 | |
| | | | 714/6.21 |
| 2014/0215590 A1 | 7/2014 | Brand | |
| 2014/0229654 A1* | 8/2014 | Goss .................. G06F 12/0246 | |
| | | | 711/103 |
| 2014/0230017 A1 | 8/2014 | Saib | |
| 2014/0258526 A1 | 9/2014 | Le Sant et al. | |
| 2014/0282983 A1 | 9/2014 | Ju et al. | |
| 2014/0285917 A1 | 9/2014 | Cudak et al. | |
| 2014/0325262 A1* | 10/2014 | Cooper ............... G06F 11/1092 | |
| | | | 714/6.22 |
| 2014/0351627 A1 | 11/2014 | Best et al. | |

(56) References Cited

U.S. PATENT DOCUMENTS

| | | |
|---|---|---|
| 2014/0373104 A1 | 12/2014 | Gaddam et al. |
| 2014/0373126 A1 | 12/2014 | Hussain et al. |
| 2015/0026387 A1 | 1/2015 | Sheredy et al. |
| 2015/0074463 A1 | 3/2015 | Jacoby et al. |
| 2015/0089569 A1 | 3/2015 | Sondhi et al. |
| 2015/0095515 A1 | 4/2015 | Krithivas et al. |
| 2015/0113203 A1 | 4/2015 | Dancho et al. |
| 2015/0121137 A1 | 4/2015 | McKnight et al. |
| 2015/0134920 A1 | 5/2015 | Anderson et al. |
| 2015/0149822 A1 | 5/2015 | Coronado et al. |
| 2015/0193169 A1 | 7/2015 | Sundaram et al. |
| 2015/0378888 A1 | 12/2015 | Zhang et al. |
| 2016/0011818 A1 | 1/2016 | Hashimoto et al. |
| 2016/0098323 A1 | 4/2016 | Mutha et al. |
| 2016/0350009 A1 | 12/2016 | Cerreta et al. |
| 2016/0352720 A1 | 12/2016 | Hu et al. |
| 2016/0352830 A1 | 12/2016 | Borowiec et al. |
| 2016/0352834 A1 | 12/2016 | Borowiec et al. |

FOREIGN PATENT DOCUMENTS

| | | |
|---|---|---|
| WO | WO-2013/071087 A1 | 5/2013 |
| WO | WO-2014/110137 A1 | 7/2014 |
| WO | WO-2016/015008 A1 | 12/2016 |
| WO | WO-2016/190938 A1 | 12/2016 |
| WO | WO-2016/195759 A1 | 12/2016 |
| WO | WO-2016/195958 A1 | 12/2016 |
| WO | WO-2016/195961 A1 | 12/2016 |

OTHER PUBLICATIONS

Microsoft, "Hybrid for SharePoint Server 2013—Security Reference Architecture", <http://hybrid.office.com/img/Security_Reference_Architecture.pdf> (online), dated Oct. 2014, 53 pages.

Microsoft, "Hybrid Identity", <http://aka.ms/HybridIdentityWp> (online), dated Apr. 2014, 36 pages.

Microsoft, "Hybrid Identity Management", <http://download.microsoft.com/download/E/A/E/EAE57CD1-A80B-423C-96BB-142FAAC630B9/Hybrid_Identity_Datasheet.pdf> (online), published Apr. 2014, 17 pages.

Jacob Bellamy-McIntyre et al., "OpenID and the EnterpriseL a Model-based Analysis of Single Sign-On Authentication", 2011 15th IEEE International Enterprise Distributed Object Computing Conference (EDOC), DOI: 10.1109/EDOC.2011.26, ISBN: 978-1-4577-0362-1, <https://www.cs.auckland.ac.nz/~lutteroth/publications/McIntyreLutterothWeber2011-OpenID.pdf> (online), dated Aug. 29, 2011, 10 pages.

The International Search Report and the Written Opinoin received from the International Searching Authority (ISA/EPO) for International Application No. PCT/US2016/035492, dated Aug. 17, 2016, 10 pages.

Sweere, *Creating Storage Class Persistent Memory with NVDIMM*, Published in Aug. 2013, Flash Memory Summit 2013, <http://ww.flashmemorysummit.com/English/Collaterals/Proceedings/2013/20130814_T2_Sweere.pdf>, 22 pages.

PCMag. "Storage Array Definition". Published May 10, 2013. <http://web.archive.org/web/20130510121646/http://www.pcmag.com/encyclopedia/term/52091/storage-array>, 2 pages.

Google Search of "storage array define" performed by the Examiner on Nov. 4, 2015 for U.S. Appl. No. 14/725,278, Results limited to entries dated before 2012, 1 page.

Techopedia. "What is a disk array". Published Jan. 13, 2012. <http://web.archive.org/web/20120113053358/http://www.techopedia.com/definition/1009/disk-array>, 1 page.

Webopedia. "What is a disk array". Published May 26, 2011. <http://web/archive.org/web/20110526081214/http://www.webopedia.com/TERM/D/disk_array.html>, 2 pages.

Li et al., *Access Control for the Services Oriented Architecture*, Proceedings of the 2007 ACM Workshop on Secure Web Services (SWS '07), Nov. 2007, pp. 9-17, ACM New York, NY.

Hota et al., *Capability-based Cryptographic Data Access Control in Cloud Computing*, Int. J. Advanced Networking and Applications, col. 1, Issue 1, dated Aug. 2011, 10 pages.

Faith, "dictzip file format", GitHub.com (online). [Accessed Jul. 28, 2015], 1 page, URL: https://github.com/fidlej/idzip.

Wikipedia, "Convergent Encryption", Wikipedia.org (online), accessed Sep. 8, 2015, 2 pages, URL: en.wikipedia.org/wiki/Convergent_encryption.

Storer et al., "Secure Data Deduplication", Proceedings of the 4th ACM International Workshop on Storage Security and Survivability (StorageSS'08), Oct. 2008, 10 pages, ACM New York, NY. USA. DOI: 10.1145/1456469.1456471.

ETSI, *Network Function Virtualisation (NFV); Resiliency Requirements*, ETSI GS NFCV-REL 001, V1.1.1, http://www.etsi.org/deliver/etsi_gs/NFV-REL/001_099/001/01.01.01_60/gs_NFV-REL001v010101p.pdf (online), dated Jan. 2015, 82 pages.

Kong, *Using PCI Express as the Primary System Interconnect in Multiroot Compute, Storage, Communications and Embedded Systems*, White Paper, IDT.com (online), Aug. 28, 2008, 12 pages, URL: www.idt.com/document/whp/idt-pcie-multi-root-white-paper.

Hu et al., *Container Marking: Combining Data Placement, Garbage Collection and Wear Levelling for Flash*, 19th Annual IEEE International Symposium on Modelling, Analysis, and Simulation of Computer and Telecommunications Systems, Jul. 25-27, 2011, 11 pages, ISBN: 978-0-7695-4430-4, DOI: 10.1109/MASCOTS.2011.50.

International Search Report and Written Opinion, PCT/US2016/015006, dated Apr. 29, 2016, 12 pages.

International Search Report and Written Opinion, PCT/US2016/015008, dated May 4, 2016, 12 pages.

International Search Report and Written Opinion, PCT/US2016/020410, dated Jul. 8, 2016, 17 pages.

International Search Report and Written Opinion, PCT/US2016/032084, dated Jul. 18, 2016, 12 pages.

International Search Report and Written Opinion, PCT/US2016/016333, dated Jun. 8, 2016, 12 pages.

International Search Report and Written Opinion, PCT/US2016/036693, dated Aug. 29, 2016, 10 pages.

International Search Report and Written Opinion, PCT/US2016/038758, dated Oct. 7, 2016, 10 pages.

International Search Report and Written Opinion, PCT/US2016/040393, dated Sep. 22, 2016, 10 pages.

International Search Report and Written Opinion, PCT/US2016/044020, dated Sep. 30, 2016, 11 pages.

International Search Report and Written Opinion, PCT/US2016/044874, dated Oct. 7, 2016, 11 pages.

International Search Report and Written Opinion, PCT/US2016/044875, dated Oct. 5, 2016, 13 pages.

International Search Report and Written Opinion, PCT/US2016/044876, dated Oct. 21, 2016, 12 pages.

International Search Report and Written Opinion, PCT/US2016/044877, dated Sep. 29, 2016, 13 pages.

International Search Report and Written Opinion, PCT/US2017/012444, dated Apr. 7, 2017, 11 pages.

\* cited by examiner

MIGRATING DATA IN A STORAGE ARRAY THAT INCLUDES A PLURALITY OF STORAGE DEVICES

BACKGROUND

Technical Field

The field of the invention is data processing, or, more specifically, methods, apparatus, and products for migrating data in a storage array that includes a plurality of storage devices.

Background Art

Modern storage systems can include many storage devices. As storage technology advances and a particular storage system ages, the storage devices that are included within the particular storage system may become less efficient than their more modern counterparts in terms of power consumption, response times, storage density, and other measures. As such, a system administrator or other user of the particular storage system may find it desirable to upgrade the storage devices that are included within the particular storage system.

SUMMARY OF INVENTION

Methods, apparatuses, and products for migrating data in a storage array that includes a plurality of storage devices, including: detecting, by the storage array, an occurrence of a storage device evacuation event associated with one or more source storage devices; responsive to detecting the occurrence of the storage device evacuation event, identifying, by the storage array, one or more target storage devices for receiving data stored on the one or more source storage devices; reducing, by the storage array, write access to the one or more source storage devices; and migrating the data stored on the one or more source storage devices to the one or more target storage devices.

The foregoing and other objects, features and advantages of the invention will be apparent from the following more particular descriptions of example embodiments of the invention as illustrated in the accompanying drawings wherein like reference numbers generally represent like parts of example embodiments of the invention.

DESCRIPTION OF EMBODIMENTS

Figure 1:
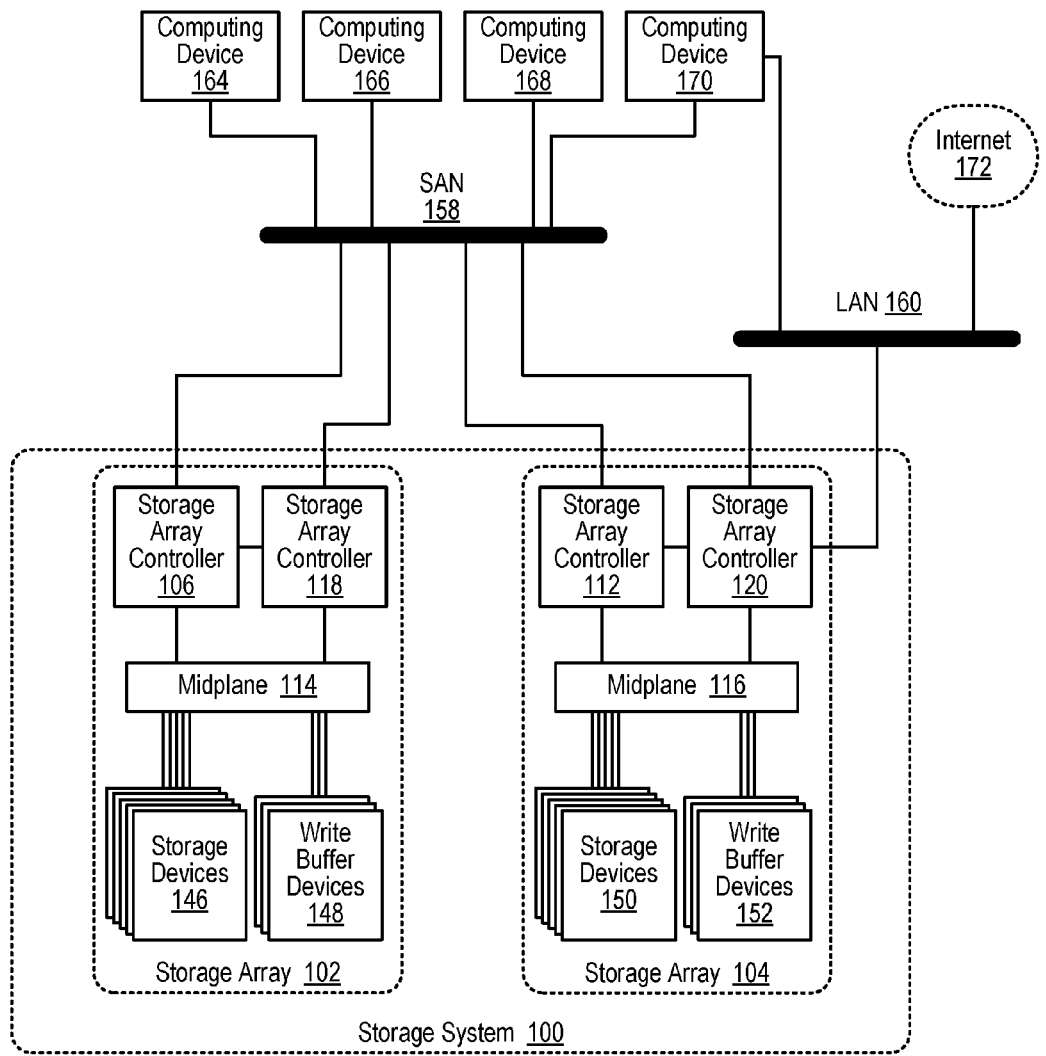
FIG. 1 sets forth a block diagram of a storage system configured for migrating data in a storage array that includes a plurality of storage devices according to embodiments of the present disclosure.

Example methods, apparatus, and products for migrating data in a storage array that includes a plurality of storage devices in accordance with the present invention are described with reference to the accompanying drawings, beginning with FIG. 1. FIG. 1 sets forth a block diagram of a storage system (100) configured for migrating data according to embodiments of the present disclosure.

The storage system (100) depicted in FIG. 1 includes a plurality of storage arrays (102, 104), although migrating data in a storage array that includes a plurality of storage devices in accordance with embodiments of the present disclosure may be carried out in storage systems that include only a single storage array. Each storage array (102, 104) may be embodied as a collection of computer hardware devices that provide persistent data storage to users of the storage system (100). Each storage array (102, 104) may include a collection of data storage devices that are mounted within one or more chassis, racks, or other enclosure. Although not expressly depicted in FIG. 1, each storage array (102, 104) may include a plurality of power supplies that deliver power to one or more components within the storage system (100) via a power bus, each storage array (102, 104) may include a plurality of data communications networks that enables one or more components within the storage system (100) to communicates, each storage array (102, 104) may include a plurality of cooling components that are used to cool one or more components within the storage system (100), and so on.

The example storage arrays (102, 104) depicted in FIG. 1 may provide persistent data storage for computing devices (164, 166, 168, 170) that are coupled to the storage system (100) via one or more data communications networks. Each of the computing devices (164, 166, 168, 170) depicted in FIG. 1 may be embodied, for example, as a server, a workstation, a personal computer, a notebook, a smartphone, a tablet computer, or the like. The computing devices (164, 166, 168, 170) in the example of FIG. 1 are coupled for data communications to the storage arrays (102, 104) through a storage area network (SAN') (158). The SAN (158) may be implemented with a variety of data communications fabrics, devices, and protocols. Example fabrics for such a SAN (158) may include Fibre Channel, Ethernet, Infiniband, Serial Attached Small Computer System Interface ('SAS'), and the like. Example data communications protocols for use in such a SAN (158) may include Advanced Technology Attachment ('ATA'), Fibre Channel Protocol, Small Computer System Interface ('SCSI'), iSCSI, HyperSCSI, and others. Readers will appreciate that a SAN is just one among many possible data communications couplings which may be implemented between a computing device (164, 166, 168, 170) and a storage array (102, 104). For example, the storage devices (146, 150) within the storage arrays (102, 104) may also be coupled to the computing devices (164, 166, 168, 170) as network attached storage ('NAS') capable of facilitating file-level access, or even using a SAN-NAS hybrid that offers both file-level protocols and block-level protocols from the same system. Any other such data communications coupling is well within the scope of embodiments of the present disclosure.

The computing devices (164, 166, 168, 170) depicted in FIG. 1 are also coupled for data communications to the storage arrays (102, 104) through a local area network ('LAN') (160). The LAN (160) of FIG. 1 may also be implemented with a variety of fabrics and protocols. Examples of such fabrics include Ethernet (802.3), wireless (802.11), and the like. Examples of such data communications protocols include Transmission Control Protocol ('TCP'), User Datagram Protocol ('UDP'), Internet Protocol ('IP'), HyperText Transfer Protocol ('HTTP'), Wireless Access Protocol ('WAP'), Handheld Device Transport Protocol (1-IDTP'), Real Time Protocol ('RTP') and others as will occur to those of skill in the art. The LAN (160) depicted in FIG. 1 may be coupled to other computing devices not illustrated in FIG. 1, for example, via the Internet (172). Although only one storage array controller (120) in one storage array (104) is expressly depicted as being coupled to the computing devices (164, 166, 168, 170) via the LAN (160), readers will appreciate that other storage array controllers (106, 112, 118) in any of the storage arrays (102, 104) in the storage system (100) may also be coupled to the computing devices (164, 166, 168, 170) via the same LAN (160) or via a different LAN.

Each storage array (102, 104) depicted in FIG. 1 includes a plurality of storage array controllers (106, 112, 118, 120). Each storage array controller (106, 112, 118, 120) may be embodied as a module of automated computing machinery comprising computer hardware, computer software, or a combination of computer hardware and software. Each storage array controller (106, 112, 118, 120) may be configured to carry out various storage-related tasks such as, for example, writing data received from the one or more of the computing devices (164, 166, 168, 170) to storage, erasing data from storage, retrieving data from storage to provide the data to one or more of the computing devices (164, 166, 168, 170), monitoring and reporting of disk utilization and performance, performing RAID (Redundant Array of Independent Drives) or RAID-like data redundancy operations, compressing data, encrypting data, and so on.

Each storage array controller (106, 112, 118, 120) may be implemented in a variety of ways, including as a Field Programmable Gate Array ('FPGA'), a Programmable Logic Chip ('PLC'), an Application Specific Integrated Circuit ('ASIC'), or computing device that includes discrete components such as a central processing unit, computer memory, and various adapters. Each storage array controller (106, 112, 118, 120) may include, for example, a data communications adapter configured to support communications via the SAN (158) and the LAN (160). Although only one of the storage array controllers (120) in the example of FIG. 1 is depicted as being coupled to the LAN (160) for data communications, readers will appreciate that each storage array controller (106, 112, 118, 120) may be independently coupled to the LAN (160). Each storage array controller (106, 112, 118, 120) may also include, for example, an I/O controller or the like that couples the storage array controller (106, 112, 118, 120) for data communications, through a midplane (114, 116), to a number of storage devices (146, 150), and a number of write buffer devices (148, 152) that are utilized as write caches.

In the example depicted in FIG. 1, the presence of multiple storage array controllers (106, 112, 118, 120) in each storage array (102, 104) can enable each storage array (102, 104) to be highly available as there are independent, redundant storage array controllers (106, 112, 118, 120) that are capable of servicing access requests (e.g., reads, writes) to the storage arrays (102, 104). In some embodiments, each storage array controller (106, 112, 118, 120) in a particular storage array (102, 104) may appear to be active to the computing devices (164, 166, 168, 170) as each storage array controller (106, 112, 118, 120) may be available for receiving requests to access the storage array (102, 104) from the computing devices (164, 166, 168, 170) via the SAN (158) or LAN (160). Although storage array controller (106, 112, 118, 120) may be available for receiving requests to access the storage array (102, 104), however, in some embodiments only one storage array controller (106, 112, 118, 120) may actively be allowed to direct access requests to the storage devices (146, 150) or write buffer devices (148, 152). For ease of explanation, a storage array controller that is allowed to direct access requests to the storage devices (146, 150) or write buffer devices (148, 152) may be referred to herein as an 'active' storage array controller whereas a storage array controller that is not allowed to direct access requests to the storage devices (146, 150) or write buffer devices (148, 152) may be referred to herein as a 'passive' storage array controller. Readers will appreciate that because a passive storage array controller may still receive requests to access the storage array (102, 104) from the computing devices (164, 166, 168, 170) via the SAN (158) or LAN (160), the passive storage array controller may be configured to forward any access requests received by the passive storage array controller to the active storage array controller.

Consider an example in which a first storage array controller (106) in a first storage array (102) is the active storage array controller that is allowed to direct access requests to the storage devices (146) or write buffer devices (148) within the first storage array (102), while a second storage array controller (118) in the first storage array (102) is the passive storage array controller that is not allowed to direct access requests to the storage devices (146) or write buffer devices (148) within the first storage array (102). In such an example, the second storage array controller (118) may continue to receive access requests from the computing devices (164, 166, 168, 170) via the SAN (158) or LAN (160). Upon receiving access requests from the computing devices (164, 166, 168, 170), the second storage array controller (118) may be configured to forward such access requests to the first storage array controller (106) via a communications link between the first storage array controller (106) and the second storage array controller (118). Readers will appreciate that such an embodiment may reduce the amount of coordination that must occur between the first storage array controller (106) and the second storage array controller (118) relative to an embodiment where both storage array controllers (106, 118) are allowed to simultaneously modify the contents of the storage devices (146) or write buffer devices (148).

Although the example described above refers to an embodiment where the first storage array controller (106) is the active storage array controller while the second storage array controller (118) is the passive storage array controller, over time such designations may switch back and forth. For example, an expected or unexpected event may occur that results in a situation where the first storage array controller (106) is the passive storage array controller while the second storage array controller (118) is the active storage array controller. An example of an unexpected event that could cause a change in the roles of each storage array controller (106, 118) is the occurrence of a failure or error condition with the first storage array controller (106) that causes the storage array (102) to fail over to the second storage array controller (118). An example of an expected event that could cause a change in the roles of each storage array controller (106, 118) is the expiration of a predetermined period of time, as the first storage array controller (106) may be responsible for interacting with the storage devices (146) and the write buffer devices (148) during a first time period while the second storage array controller (118) may be responsible for interacting with the storage devices (146) and the write buffer devices (148) during a second time period. Readers will appreciate that although the preceding paragraphs describe active and passive storage array controllers with reference to the first storage array (102), the storage array controllers (112, 120) that are part of other storage arrays (104) in the storage system (100) may operate in a similar manner.

Each storage array (102, 104) depicted in FIG. 1 includes one or more write buffer devices (148, 152). Each write buffer device (148, 152) may be configured to receive, from the one of the storage array controller (106, 112, 118, 120), data to be stored in one or more of the storage devices (146, 150). Readers will appreciate that writing data to the write buffer device (148, 152) may be carried out more quickly than writing data to the storage device (146, 150). The storage array controllers (106, 112, 118, 120) may therefore be configured to effectively utilize the write buffer devices (148, 152) as a quickly accessible buffer for data destined to be written to one or the storage devices (146, 150). By utilizing the write buffer devices (148, 152) in such a way, the write latency experienced by users of the storage system (100) may be significantly improved relative to storage systems that do not include such write buffer devices (148, 152). The write latency experienced by users of the storage system (100) may be significantly improved relative to storage systems that do not include such write buffer devices (148, 152) because the storage array controllers (106, 112, 118, 120) may send an acknowledgment to the user of the storage system (100) indicating that a write request has been serviced once the data associated with the write request has been written to one or the write buffer devices (148, 152), even if the data associated with the write request has not yet been written to any of the storage devices (146, 150).

The presence of the write buffer devices (148, 152) may also improve the utilization of the storage devices (146, 150) as a storage array controller (106, 112, 118, 120) can accumulate more writes and organize writing to the storage devices (146, 150) for greater efficiency. Greater efficiency can be achieved, for example, as the storage array controller (106, 112, 118, 120) may have more time to perform deeper compression of the data, the storage array controller (106, 112, 118, 120) may be able to organize the data into write blocks that are in better alignment with the underlying physical storage on the storage devices (146, 150), the storage array controller (106, 112, 118, 120) may be able to perform deduplication operations on the data, and so on. Such write buffer devices (148, 152) effectively convert storage arrays of solid-state drives (e.g., "Flash drives") from latency limited devices to throughput limited devices. In such a way, the storage array controller (106, 112, 118, 120) may be given more time to better organize what is written to the storage devices (146, 150), but after doing so, are not then mechanically limited like disk-based arrays are.

Each storage array (102, 104) depicted in FIG. 1 includes one or more storage devices (146, 150). A 'storage device' as the term is used in this specification refers to any device configured to record data persistently. The term 'persistently' as used here refers to a device's ability to maintain recorded data after loss of a power source. Examples of storage devices may include mechanical, spinning hard disk drives, solid-state drives, and the like.

The storage array controllers (106, 112) of FIG. 1 may be useful in migrating data in a storage array that includes a plurality of storage devices according to embodiments of the present disclosure. The storage array controllers (106, 112) may assist in migrating data in a storage array that includes a plurality of storage devices by: detecting an occurrence of a storage device evacuation event associated with one or more source storage devices; responsive to detecting the occurrence of the storage device evacuation event, identifying one or more target storage devices for receiving data stored on the one or more source storage devices; reducing write access to the one or more source storage devices; migrating the data stored on the one or more source storage devices to the one or more target storage devices; blocking all write access to the one or more source storage devices; enabling read-only access to the one or more source storage devices; copying, from the one or more source storage devices, the data stored on the one or more source storage devices; writing the data copied from the one or more source storage devices to the one or more target storage devices; initiating a garbage collection process on the one or more source storage devices, wherein the garbage collection process identifies valid data on the one or more source storage devices and invalid data on the one or more source storage devices; writing the valid data identified by the garbage collection process to the one or more target storage devices; utilizing redundancy data in the storage array to rebuild the data onto the one or more target storage devices; receiving a user-initiated request to migrate data away from the one or more source storage devices; erasing the data stored on the one or more source storage devices, and performing other functions as will be described in greater detail below.

The arrangement of computing devices, storage arrays, networks, and other devices making up the example system illustrated in FIG. 1 are for explanation, not for limitation. Systems useful according to various embodiments of the present disclosure may include different configurations of servers, routers, switches, computing devices, and network architectures, not shown in FIG. 1, as will occur to those of skill in the art.

Migrating data in a storage array that includes a plurality of storage devices in accordance with embodiments of the present disclosure is generally implemented with computers. In the system of FIG. 1, for example, all the computing devices (164, 166, 168, 170) and storage controllers (106, 112, 118, 120) may be implemented to some extent at least as computers. For further explanation, therefore, FIG. 2 sets forth a block diagram of a storage array controller (202) useful in migrating data in a storage array that includes a plurality of storage devices according to embodiments of the present disclosure.

Figure 2:
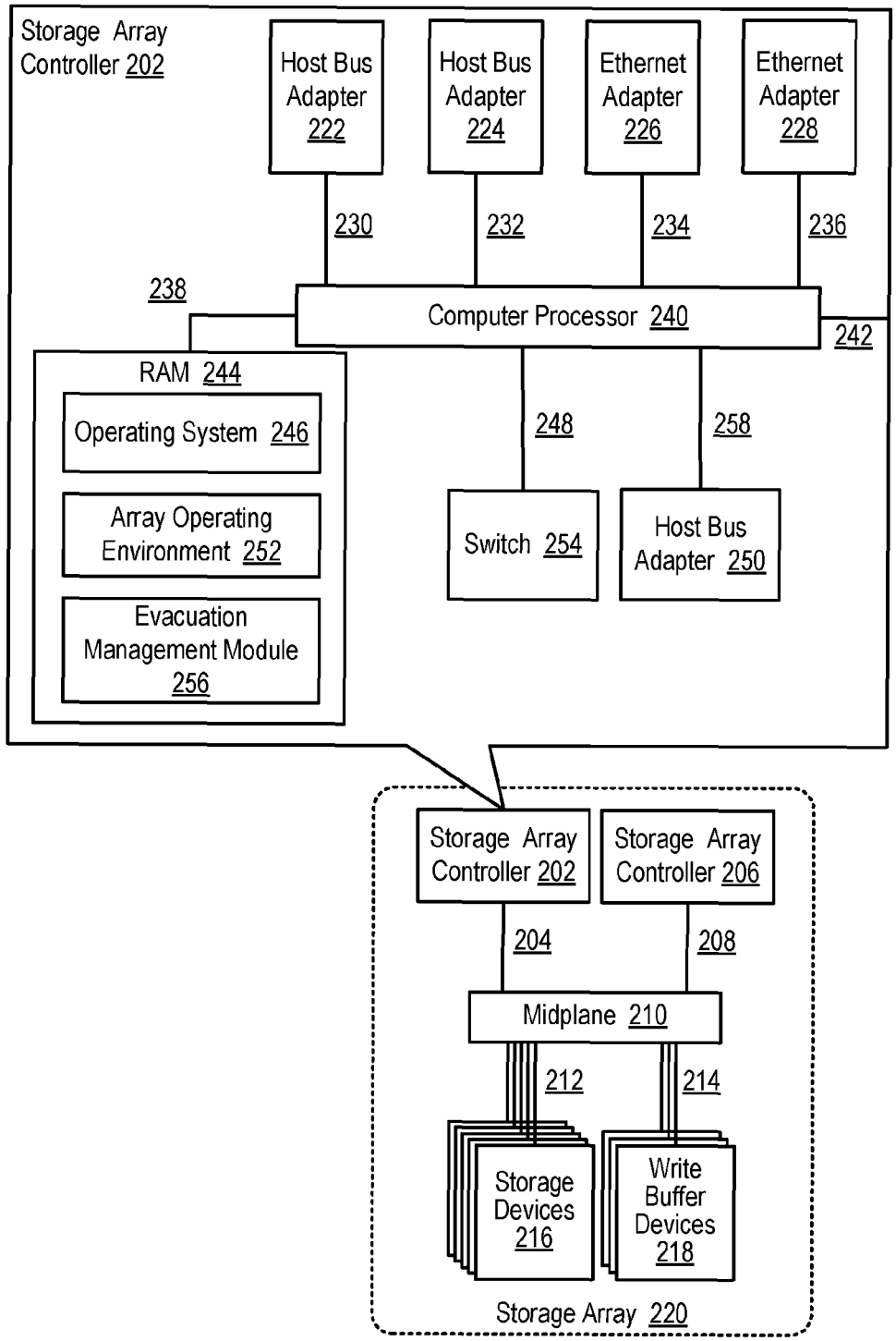
FIG. 2 sets forth a block diagram of a storage array controller useful in migrating data in a storage array that includes a plurality of storage devices according to embodiments of the present disclosure.

The storage array controllers (202, 206) depicted in FIG. 2 may be similar to the storage array controllers depicted in FIG. 1, as the storage array controllers (202, 206) of FIG. 2 may be communicatively coupled, via a midplane (210), to one or more storage devices (216) and to one or more write buffer devices (218) that are included as part of a storage array (220). The storage array controllers (202, 206) may be coupled to the midplane (210) via one or more data communications links (204, 208) and the midplane (206) may be coupled to the storage devices (216) and the memory buffer devices (218) via one or more data communications links (212, 214). The data communications links (204, 208, 212, 214) of FIG. 2 may be embodied, for example, as a Peripheral Component Interconnect Express ('PCIe') bus, as a SAS data communications link, and so on. Although only one of the storage array controllers (202) is depicted in detail, readers will appreciate that other storage array controllers (206) may include similar components. For ease of explanation, however, the detailed view of one of the storage array controllers (202) will be described below.

The storage array controller (202) detailed in FIG. 2 can include at least one computer processor (240) or 'CPU' as well as random access memory ('RAM') (244). The computer processor (240) may be connected to the RAM (244) via a data communications link (238), which may be embodied as a high speed memory bus such as a Double-Data Rate 4 ('DDR4') bus. Although the storage array controller (202) detailed in FIG. 2 includes only a single computer processor, however, readers will appreciate that storage array controllers useful in migrating data in a storage array that includes a plurality of storage devices according to embodiments of the present disclosure may include additional computer processors. Likewise, although the storage array controller (202) detailed in FIG. 2 includes only a RAM (244), readers will appreciate that storage array controllers useful in migrating data in a storage array that includes a plurality of storage devices according to embodiments of the present disclosure may include additional forms of computer memory such as flash memory.

The storage array controller (202) detailed in FIG. 2 includes an operating system (246) that is stored in RAM (246). Examples of operating systems useful in storage array controllers (202, 206) configured for migrating data in a storage array that includes a plurality of storage devices according to embodiments of the present disclosure include UNIX, Linux™ Microsoft Windows™, and others as will occur to those of skill in the art. The operating system (246) depicted in FIG. 2 may be embodied, for example, as system software that manages computer hardware and software resources on the storage array controller (202).

The storage array controller (202) detailed in FIG. 2 also includes an array operating environment (252) that is stored in RAM (244). The array operating environment (252) may be embodied as one or more modules of computer program instructions used to enable the storage array controller (202) to service access requests that are directed to the storage array (220). The array operating environment (252) may be responsible for generating I/O requests (e.g., read requests, write requests) that are sent to the storage devices (216) or the write buffer devices (218). The array operating environment (252) may be further configured to perform various functions that result in more efficient utilization of the resources within the storage array (220). The array operating environment (252) may be configured, for example, to compress data prior to writing the data to one of the storage devices (216), to perform data deduplication operations, to pool data that is to be written to one of the storage devices (216) so that data may be written in blocks of a predetermined size, and so on.

The storage array controller (202) detailed in FIG. 2 also includes an evacuation management module (256), a module that includes computer program instructions useful in migrating data in a storage array that includes a plurality of storage devices according to embodiments of the present disclosure. The evacuation management module (256) may be executed on computer hardware such as the computer processor (240) of the storage array controller (202), thereby enabling the storage array controller (202) to migrate data by: detecting an occurrence of a storage device evacuation event associated with one or more source storage devices; responsive to detecting the occurrence of the storage device evacuation event, identifying one or more target storage devices for receiving data stored on the one or more source storage devices; reducing write access to the one or more source storage devices; migrating the data stored on the one or more source storage devices to the one or more target storage devices; blocking all write access to the one or more source storage devices; enabling read-only access to the one or more source storage devices; copying, from the one or more source storage devices, the data stored on the one or more source storage devices; writing the data copied from the one or more source storage devices to the one or more target storage devices; initiating a garbage collection process on the one or more source storage devices, wherein the garbage collection process identifies valid data on the one or more source storage devices and invalid data on the one or more source storage devices; writing the valid data identified by the garbage collection process to the one or more target storage devices; utilizing redundancy data in the storage array to rebuild the data onto the one or more target storage devices; receiving a user-initiated request to migrate data away from the one or more source storage devices; erasing the data stored on the one or more source storage devices; and performing other steps as described in more detail below.

The storage array controller (202) detailed in FIG. 2 also includes a plurality of host bus adapters (222, 224, 250) that are coupled to the computer processor (240) via a data communications link (230, 232, 258). Each host bus adapter (222, 224, 250) may be embodied as a module of computer hardware that connects the host system (i.e., the storage array controller) to other network and storage devices. Each of the host bus adapters (222, 224, 250) of FIG. 2 may be embodied, for example, as a Fibre Channel adapter that enables the storage array controller (202) to connect to a SAN, as a Target Channel Adapter, as a SCSI/Storage Target Adapter, and so on. The storage array controller also includes a plurality of Ethernet adapters (226, 228) that enables the storage array controller (202) to connect to a LAN, although readers will appreciate that other types of network adapters may be utilized in accordance with embodiments of the present disclosure. Each of the host bus adapters (222, 224, 250) and Ethernet adapters (226, 228) may be coupled to the computer processor (240) via a data communications link (230, 232, 234, 236, 258) such as, for example, a PCIe bus.

The storage array controller (202) detailed in FIG. 2 also includes a switch (254) that is coupled to the computer processor (240) via a data communications link (248). The switch (254) of FIG. 2 may be embodied as a computer hardware device that can create multiple endpoints out of a single endpoint, thereby enabling multiple devices to share what was initially a single endpoint. The switch (254) of FIG. 2 may be embodied, for example, as a PCIe switch that is coupled to a PCIe bus and presents multiple PCIe connection points to the midplane (210).

The storage array controller (202) of FIG. 2 may also include a data communications link (242) for coupling the storage array controller (202) to other storage array controllers (206). Such a data communications link (242) may be embodied, for example, as a QuickPath Interconnect ('QPI') interconnect, as PCIe non-transparent bridge ('NTB') interconnect, and so on. Readers will recognize that the components, protocols, adapters, and architectures described above and depicted in the figures are for illustration only, not limitation. Such a storage array controller may be implemented in a variety of different ways, each of which is well within the scope of the present disclosure.

Figure 3:
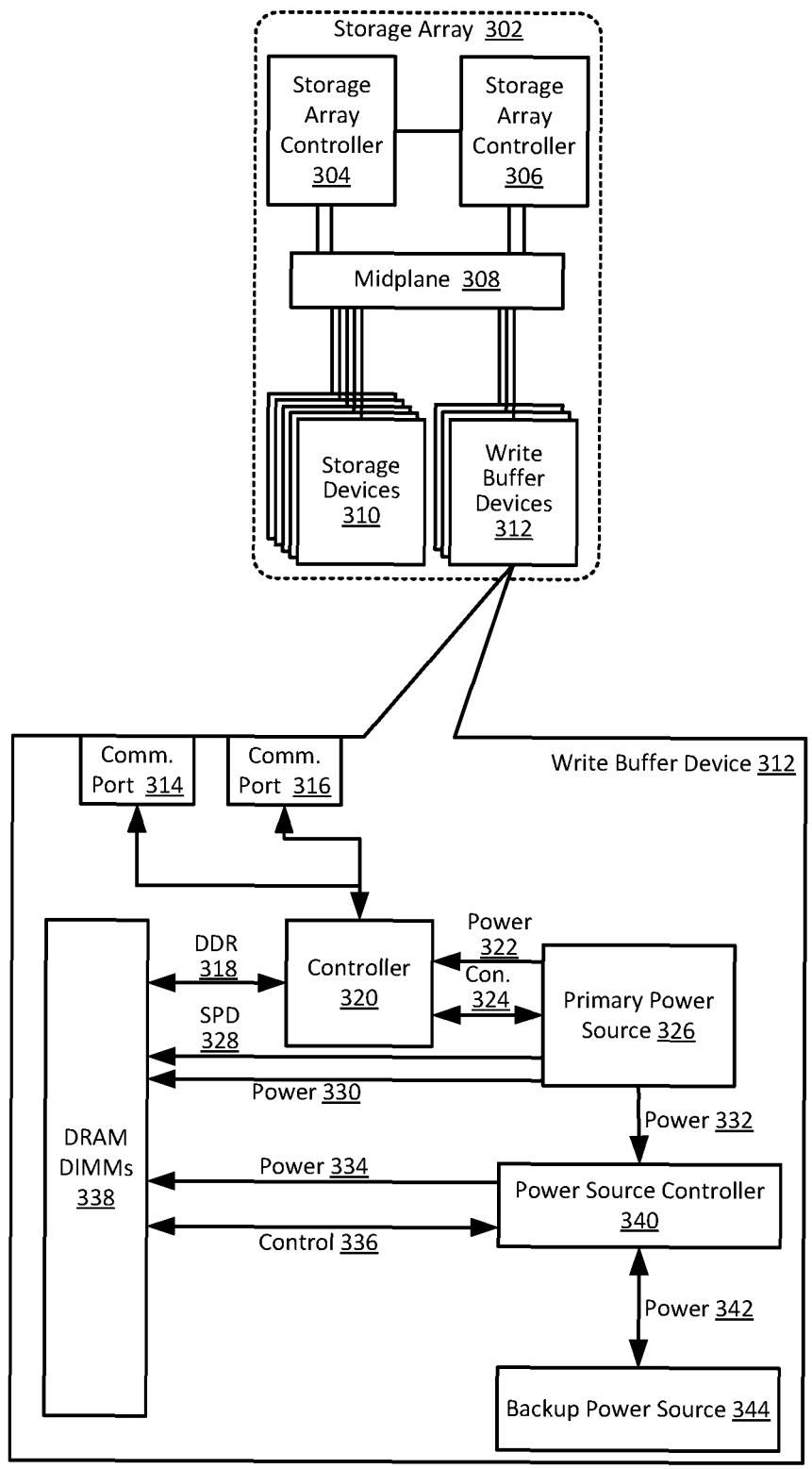
FIG. 3 sets forth a block diagram of a storage system configured for migrating data in a storage array that includes a plurality of storage devices according to embodiments of the present disclosure.

For further explanation, FIG. 3 sets forth a block diagram illustrating a write buffer device (312) useful in migrating data in a storage array that includes a plurality of storage devices according to embodiments of the present invention. The write buffer device (312) depicted in FIG. 3 is similar to the write buffer devices depicted in FIG. 1 and FIG. 2. The write buffer device (312) may be included in a storage array (302) that includes a plurality of storage array controllers (304, 306) that are communicatively coupled to a plurality of storage devices (310) and also communicatively coupled to a plurality of write buffer devices (312) via a midplane (308).

The write buffer device (312) depicted in FIG. 3 includes two data communications ports (314, 316). The data communications ports (314, 316) of FIG. 3 may be embodied as computer hardware for communicatively coupling the write buffer device (312) to a storage array controller (304, 306) via the midplane (308). For example, the write buffer device (312) may be communicatively coupled to the first storage array controller (304) via a first data communications port (314) and the write buffer device (312) may also be communicatively coupled to the second storage array controller (306) via a second data communications port (316). Although the write buffer device (312) depicted in FIG. 3 includes two data communications ports (314, 316), readers will appreciate that write buffer devices useful for buffering data to be written to an array of non-volatile storage devices may include only one data communications port or, alternatively, additional data communications ports not depicted in FIG. 3.

The write buffer device (312) depicted in FIG. 3 also includes a controller (320). The controller (320) depicted in FIG. 3 may be embodied, for example, as computer hardware for receiving memory access requests (e.g., a request to write data to memory in the write buffer device) via the data communications ports (314, 316) and servicing such memory access requests. The controller (320) depicted in FIG. 3 may be embodied, for example, as an ASIC, as a microcontroller, and so on. The controller (320) depicted in FIG. 3 may be communicatively coupled the data communications ports (314, 316), for example, via a PCIe data communications bus.

The write buffer device (312) depicted in FIG. 3 also includes a plurality of DRAM memory modules, embodied in FIG. 3 as DRAM dual in-line memory modules ('DIMMs') (338). The DRAM DIMMs (338) depicted in FIG. 3 may be coupled to the controller (320) via a memory bus such as a DDR (318) memory bus such that the controller (320) can be configured to write data to the DRAM DIMMs (338) via the DDR (318) memory bus.

The write buffer device (312) depicted in FIG. 3 also includes a primary power source (326). The primary power source (326) may be embodied as computer hardware for providing electrical power to the computing components that are within the write buffer device (312). The primary power source (326) may be embodied, for example, as a switched-mode power supply that supplies electric energy to an electrical load by converting alternating current ('AC') power from a mains supply to a direct current (DC') power, as a DC-to-DC converter that converts a source of DC from one voltage level to another, and so on. The primary power source (326) of FIG. 3 is coupled to the controller (320) via a power line (322) that the primary power source (326) can use to deliver power to the controller (320). The primary power source (326) of FIG. 3 is also coupled to the DRAM DIMMs (338) via a power line (330) that the primary power source (326) can use to deliver power to the DRAM DIMMs (338). The primary power source (326) of FIG. 3 is also coupled to a power source controller (340) via a power line (332) that the primary power source (326) can use to deliver power to the power source controller (340). The primary power source (326) can monitor which components are receiving power through the use of one or more control lines (324), serial presence detect (' SPD') lines (328), or other mechanism for detecting the presence of a device and detecting that power is being provided to the device. Readers will appreciate that write devices useful for buffering data to be written to an array of non-volatile storage devices may include additional computing components not depicted in FIG. 3, each of which may also receive power from the primary power source (326).

The write buffer device (312) depicted in FIG. 3 also includes a backup power source (344). The backup power source (344) depicted in FIG. 3 represents a power source capable of providing power to the DRAM DIMMs (338) in the event that the primary power source (326) fails. In such a way, the DRAM DIMMs (338) may effectively serve as non-volatile memory, as a failure of the primary power source (326) will not cause the contents of the DRAM DIMMs (338) to be lost because the DRAM DIMMs (338) will continue to receive power from the backup power source (344). Such a backup power source (344) may be embodied, for example, as a supercapacitor.

The write buffer device (312) depicted in FIG. 3 also includes a power source controller (340). The power source controller (340) depicted in FIG. 3 may be embodied as a module of computer hardware configured to identify a failure of the primary power source (326) and to cause power to be delivered to the DRAM DIMMs (338) from the backup power source (344). In such an example, power may be delivered to the DRAM DIMMs (338) from the backup power source (344) via a first power line (342) between the power source controller (340) and the backup power source (344), as well as a second power line (334) between the backup power source controller (340) and the DRAM DIMMs (338). The backup power source controller (340) depicted in FIG. 3 may be embodied, for example, as an analog circuit, an ASIC, a microcontroller, and so on. The power source controller (340) can monitor whether the DRAM DIMMs (338) have power through the use of one or more control lines (336) that may be coupled to the DRAM DIMMs (338), as well as one or more control lines that may be coupled to the primary power source (326). In such an example, by exchanging signals between the DRAM DIMMs (338), the primary power source (326), and the power source controller (340), the power source controller (340) may identify whether power is being provided to the DRAM DIMMs (338) by the primary power source (326).

In the example depicted in FIG. 3, the controller (320) may be configured to receive, from a storage array controller (304, 306) via the one or more data communications ports (314, 316), an instruction to write data to the one or more DRAM DIMMs (338). Such an instruction may include, for example, the location at which to write the data, the data to be written to the DRAM DIMMs (338), the identity of the host that issued the instruction, the identity of a user associated with the instruction, or any other information needed to service the instruction. In the example depicted in FIG. 3, the NVRAM controller (320) may be further configured to write the data to the one or more DRAM DIMMs (338) in response to receiving such an instruction.

In the example depicted in FIG. 3, the controller (320) may be further configured to send an acknowledgment indicating that the data has been written to the array (302) of non-volatile storage devices in response to writing the data to the one or more DRAM DIMIVIs (338). The controller (320) may send the acknowledgment indicating that the data has been written to the storage array (302) in response to writing the data to the DRAM DIMIVIs (338) in the write buffer device (312). Readers will appreciate that although some forms of DRAM DIMMs (338) are considered to be volatile memory, because the DRAM DIMMs (338) are backed by redundant power sources (326, 344), writing the data to the DRAM DIMMs (338) in the write buffer device (312) may be treated the same as writing the data to traditional forms of non-volatile memory such as the storage devices (310). Furthermore, the DRAM DIMMs (338) in the write buffer device (312) can include one or more NVDIMMs. As such, once the data has been written to the DRAM DIMMs (338) in the write buffer device (312), an acknowledgement may be sent indicating that the data has been safely and persistently written to the storage array (302).

In the example depicted in FIG. 3, the controller (320) may be further configured to determine whether the primary power source (326) has failed. The controller (320) may determine whether the primary power source (326) has failed, for example, by receiving a signal over the control line (324) indicating that the primary power source (326) has failed or is failing, by detecting a lack of power from the primary power source (326), and so on. In such an example, the controller (320) may be coupled to the backup power source (344) or may have access to another source of power such that the controller (320) can remain operational if the primary power source (326) does fail.

In the example depicted in FIG. 3, the controller (320) may be further configured to initiate a transfer of data contained in the one or more DRAM DIMMs (338) to flash memory in the write buffer device (312) in response to determining that the primary power source (326) has failed. The controller (320) may initiate a transfer of data contained in the one or more DRAM DIMMs (338) to flash memory (not shown) in the write buffer device (312), for example, by signaling an NVDIMM to write the data contained in the one or more DRAM DIMMs (338) to flash memory on the NVDIMM.

Figure 4:
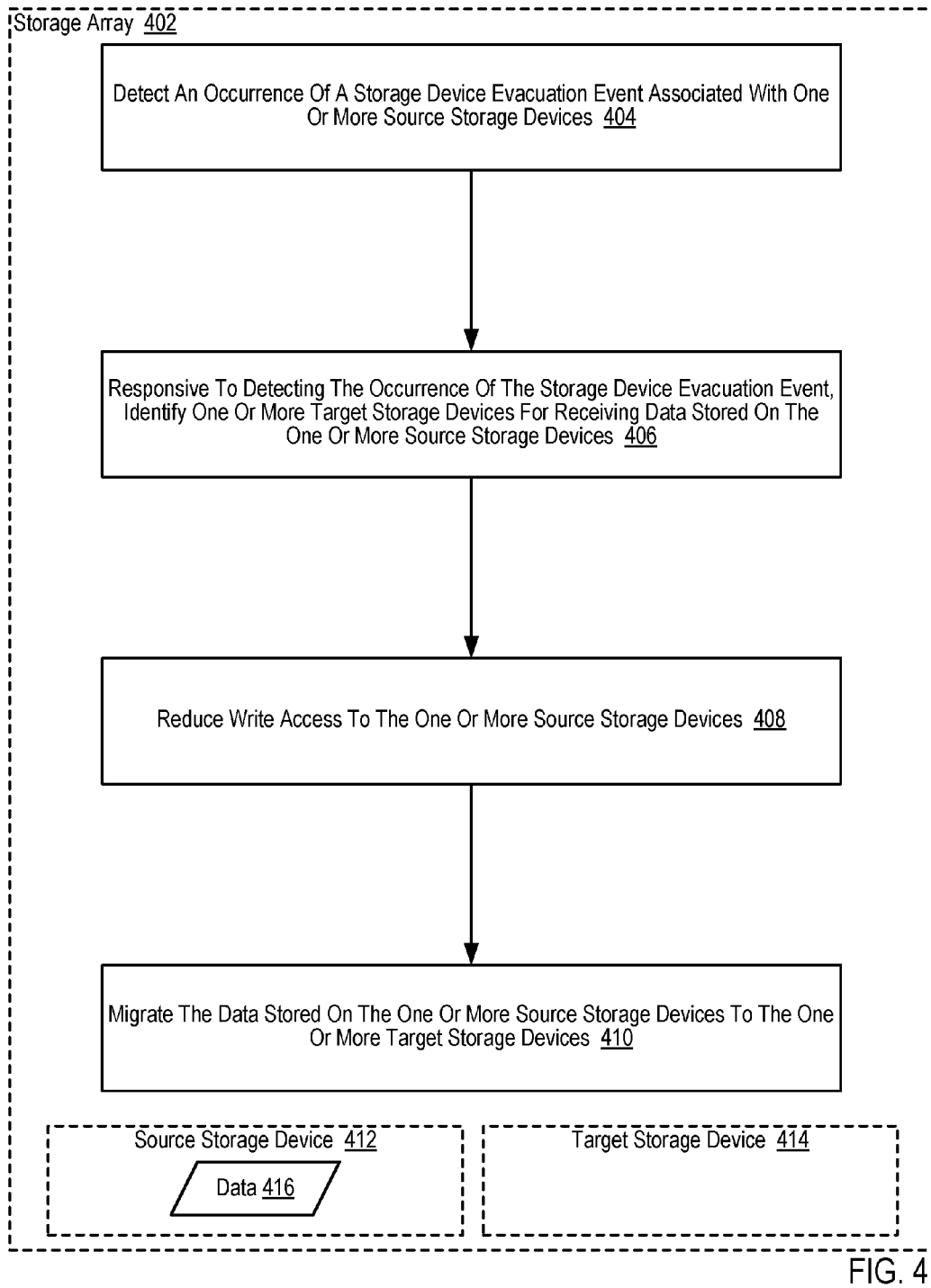
FIG. 4 sets forth a flow chart illustrating an example method for migrating data in a storage array that includes a plurality of storage devices according to embodiments of the present disclosure.

For further explanation, FIG. 4 sets forth a flow chart illustrating an example method for migrating data (416) in a storage array (402) that includes a plurality of storage devices (412, 414) according to embodiments of the present disclosure. Although depicted in less detail, the storage array (402) depicted in FIG. 4 may be similar to the storage arrays described above with reference to FIGS. 1-3. The storage array (402) may therefore include a plurality of storage array controllers, storage devices, write buffer devices, and so on. Readers will appreciate that the storage array (402) depicted in FIG. 4 may also be part of a larger storage system that includes a plurality of storage arrays.

The example method depicted in FIG. 4 includes detecting (404), by the storage array (402), an occurrence of a storage device evacuation event associated with one or more source storage devices (412). A storage device evacuation event may indicate that the one or more source storage devices (412) should no longer be written to as the one or more source storage devices (412) will ultimately be removed from the storage array (402). Before the one or more source storage devices (412) are removed from the storage array (402), however, valid data on the one or more source storage devices (412) should be relocated to other storage devices (414) in the storage array (402). The storage device evacuation event may be embodied, for example, as an event that is generated in response to a system administrator or other administrative entity indicating that the one or more source storage devices (412) are designated for removal from the storage array (402). The system administrator or other administrative entity may indicate that the one or more source storage devices (412) are designated for removal from the storage array (402), for example, through the use of a special purpose user interface (e.g., a GUI presented on a display screen) that presents an inventory of the storage devices (412, 414) that are included in the storage array (402) and that also allowed the user of the special purpose user interface to select one or more source storage devices (412) that are to be designated for removal from the storage array (402).

In the example method depicted in FIG. 4, detecting (404) an occurrence of a storage device evacuation event associated with one or more source storage devices (412) may be carried out by a special purpose module of computer program instructions that is executing on computer hardware within the storage array (402). Such a special purpose module of computer program instructions may be a standalone module or may be included within a larger module such as, for example, the array operating environment described above with reference to FIG. 2. Such a special purpose module of computer program instructions may be executing, for example, on one or more computer processors within an array management server, on one or more computer processors within a storage array controller that is similar to the storage array controllers described above, or on other computer hardware within the storage array (402).

Readers will appreciate that one or more source storage devices (412) may be designated for removal from the storage array (402) for a variety of reasons. For example, the more source storage devices (412) may be relatively old storage devices that have a smaller storage capacity than relatively new storage devices that may be available as replacements for the relatively old storage devices. Alternatively, the more source storage devices (412) may be relatively old storage devices that have higher access latencies and can't perform as many TOPS as relatively new storage devices that may be available as replacements for the relatively old storage devices. The one or more source storage devices (412) may therefore be designated for removal from the storage array (402) as part of an upgrade to the storage array (402). Readers will appreciate that the one or more source storage devices (412) may be designated for removal from the storage array (402) for other reasons, and readers will further appreciate that the one or more source storage devices (412) may be designated for removal from the storage array (402) in spite of the fact that the one or more source storage devices (412) may still be properly functioning with no indication that a failure of the one or more source storage devices (412) is imminent.

The example method depicted in FIG. 4 also includes identifying (406), by the storage array (402), one or more target storage devices (414) for receiving data (416) stored on the one or more source storage devices (412). Identifying (406) one or more target storage devices (414) for receiving data (416) stored on the one or more source storage devices (412) may be carried out by a special purpose module of computer program instructions that is executing on computer hardware within the storage array (402). Such a special purpose module of computer program instructions may be a standalone module or may be included within a larger module such as, for example, the array operating environment described above with reference to FIG. 2. Such a special purpose module of computer program instructions may be executing, for example, on one or more computer processors within an array management server, on one or more computer processors within a storage array controller that is similar to the storage array controllers described above, or on other computer hardware within the storage array (402).

In the example method depicted in FIG. 4, identifying (406) one or more target storage devices (414) for receiving data (416) stored on the one or more source storage devices (412) is carried out in response to detecting the occurrence of the storage device evacuation event. Upon detecting the occurrence of the storage device evacuation event, the storage array (402) may identify (406) the one or more target storage devices (414) for receiving data (416) stored on the one or more source storage devices (412) by identifying the storage devices that are most physically proximate to the source storage devices (412), by identifying the storage devices in the storage array (402) have the most available storage, and so on.

The example method depicted in FIG. 4 also includes reducing (408), by the storage array (402), write access to the one or more source storage devices (412). Reducing (408) write access to the one or more source storage devices (412) may be carried out, for example, by preventing any additional data from being written to the one or more source storage devices (412), by limiting the number of write accesses that may be directed to the one or more source storage devices (412) to a predetermined value, and so on. Readers will appreciate that by reducing (408) write access to the one or more source storage devices (412), the storage array (402) may continue to read data from the one or more source storage devices (412), but new data may not be written to the source storage devices (412) given that the new data will subsequently be migrated away from the source storage devices (412) in anticipation of removing the source storage devices (412) from the storage array (402).

Reducing (408) write access to the one or more source storage devices (412) may be carried out through the use of a special purpose module of computer program instructions that is executing on computer hardware within the storage array (402). Such a special purpose module of computer program instructions may be a standalone module or may be included within a larger module such as, for example, the array operating environment described above with reference to FIG. 2. Such a special purpose module of computer program instructions may be executing, for example, on one or more computer processors within an array management server, on one or more computer processors within a storage array controller that is similar to the storage array controllers described above, or on other computer hardware within the storage array (402). In such an example, the special purpose module of computer program instructions that is executing on computer hardware within the storage array (402) may be configured to notify each of the storage array controllers in the storage array (402) that write access to the one or more source storage devices (412) has been reduced (408), so that the storage array controllers in the storage array (402) may cease (or limit) issuing write requests to the one or more source storage devices (412).

The example method depicted in FIG. 4 also includes migrating (410) the data (416) stored on the one or more source storage devices (412) to the one or more target storage devices (414). Migrating (410) the data (416) stored on the one or more source storage devices (412) to the one or more target storage devices (414) may be carried out, for example, by writing the data (416) stored on the one or more source storage devices (412) to the one or more target storage devices (414). In such an example, once all valid data on the one or more source storage devices (412) has been migrated (410) to the one or more target storage devices (414), the one or more source storage devices (412) may be safely removed from the storage array (402). Once all of the valid data on the one or more source storage devices (412) has been migrated (410) to the one or more target storage devices (414), the source storage devices (412) may no longer considered part of quorum of storage devices. In fact, any storage devices that are inserted in place of the source storage devices (412) must be explicitly added through an enumeration process that may be carried out, for example, by an array operating environment that is executing on a particular storage array controller within the storage array (402). Such an enumeration process can be carried out by detecting the insertion of a device into the storage array (402), identifying that the inserted device is a storage device, and initializing the required routines or drivers that enable the storage devices to function. In such an example, detecting the insertion of a device into the storage array (402) may be carried out through the use of software detection mechanisms or hardware components (e.g., presence detect lines) that detect the physical presence of a device and signal the storage array controller when a device is inserted or removed from the storage array (402). Identifying that the inserted device is a storage device may be carried out, for example, by the storage array controller receiving information such as vital product data ('VPD') for the inserted device, where such VPD can be utilized by the array operating environment to identify the device. Once the device has been identified, the array operating environment may initialize drivers and routines necessary to access and utilize the device.

Readers will appreciate that if there is not sufficient space on the one or more target storage devices (414) to store the data (416) that is stored on the one or more source storage devices (412), migration (410) of the data (416) may be aborted and the storage array (402) may be rolled back to its state prior to the occurrence of the storage device evacuation event. In such an example, an array operating environment executing on a storage array controller may determine that insufficient space exists on the one or more target storage devices (414) if storing the data (416) on the one or more target storage devices (414) would cause the capacity utilization of the storage array (402) to exceed a predetermined threshold.

Readers will appreciate that in some embodiments, only the valid data that is stored on the one or more source storage devices (412) will be migrated (410) to the one or more target storage devices (414), as invalid data does not need to be retained by migrating (410) such invalid data to the one or more target storage devices (414). Consider an example in which a particular piece of data was stored at a first location within a source storage device (412). In such an example, assume that a request to modify the particular piece of data was subsequently received. In view of the fact that the source storage device (412) may be embodied as an SSD, modifying the particular piece of data cannot be accomplished by simply overwriting the data as would occur in a hard disk drive. Instead, the modified version of the particular piece of data would be written to a second location (which may or may not be on the same storage device) and the particular piece of data that was stored at the first location within the source storage device (412) would be marked as being invalid. As such, the source storage device (412) may include some invalid data that has not yet been garbage collected, and such invalid data does not need to be retained by migrating (410) the invalid data to the one or more target storage devices (414).

Figure 5:
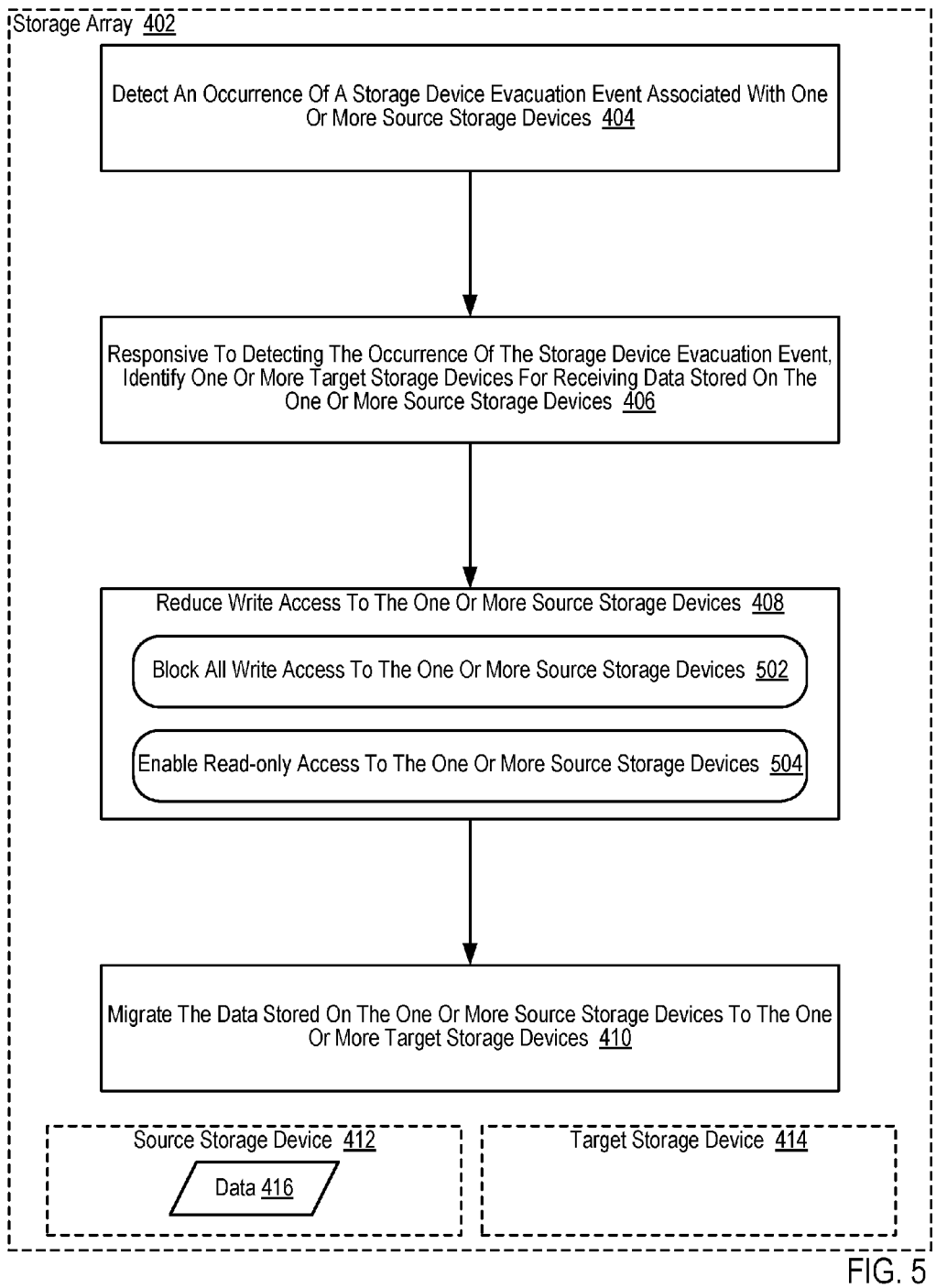
FIG. 5 sets forth a flow chart illustrating an additional example method for migrating data in a storage array that includes a plurality of storage devices according to embodiments of the present disclosure.

For further explanation, FIG. 5 sets forth a flow chart illustrating an additional example method for migrating data in a storage array that includes a plurality of storage devices according to embodiments of the present disclosure. The example method depicted in FIG. 5 is similar to the example method depicted in FIG. 4, as the example method depicted in FIG. 5 also includes detecting (404) an occurrence of a storage device evacuation event associated with one or more source storage devices (412), identifying (406) one or more target storage devices (414) for receiving data (416) stored on the one or more source storage devices (412), reducing (408) write access to the one or more source storage devices (412), and migrating (410) the data (416) stored on the one or more source storage devices (412) to the one or more target storage devices (414).

In the example method depicted in FIG. 5, reducing (408) write access to the one or more source storage devices (412) can include blocking (502) all write access to the one or more source storage devices (412). Blocking (502) all write access to the one or more source storage devices (412) may be carried out, for example, by each of the storage array controllers in the storage array (402) ceasing to issue write operations to the one or more source storage devices (412). In such an example, each storage array controller may maintain a list or other data structure that identifies all storage devices in the storage array (402) that should not be utilized to service write operations. Because the storage array controller is responsible for directing all access requests to the storage devices (412, 414) in the storage array (402), the storage array controller may ultimately enforce a policy to block (502) all write access to the one or more source storage devices (412).

In the example method depicted in FIG. 5, reducing (408) write access to the one or more source storage devices (412) can alternatively include enabling (504) read-only access to the one or more source storage devices (412). Enabling (504) read-only access to the one or more source storage devices (412) may be carried out, for example, by each of the storage array controllers in the storage array (402) ceasing to issue write operations to the one or more source storage devices (412) while also still allowing for read operations to be directed to the one or more source storage devices (412). In such an example, each storage array controller may maintain a list or other form of data repository that identifies all storage devices in the storage array (402) and associates access privileges (e.g., read-only, read-write) with each of the storage devices in the storage array (402). Because the storage array controller is responsible for directing all access requests to the storage devices (412, 414) in the storage array (402), the storage array controller may ultimately enforce a policy to enable (504) read-only access to the one or more source storage devices (412).

Readers will appreciate that in the examples described above, where write access to the one or more source storage devices (412) is reduced (408), the presence of deduplicated data on the one or more source storage devices (412) may be treated as a special case. Data deduplication is a data compression technique whereby duplicate copies of repeating data are eliminated. Through the use of data deduplication techniques, a unique chunk of data (e.g., the master copy) may be stored once in the storage array (402) and all additional occurrences of the chunk of data are replaced with a small reference that points to the stored chunk. The deduplicated data on the one or more source storage devices (412) may therefore be embodied, for example, as a piece of data that is stored on the one or more source storage devices (412), where the piece of data is pointed to by other occurrences of identical data in the storage array (402). The presence of deduplicated data on the one or more source storage devices (412) may be handled, for example, by allowing read-write access to the deduplicated data while enabling read-only access to (or blocking write access to) the remaining portions of the source storage devices (412) (e.g., those portions that do not contain deduplicated data). Alternatively, the deduplicted data may be migrated to another storage device in the storage array and all references to the deduplicated data may be updated to point to the new location where the deduplicated data is stored.

Figure 6:
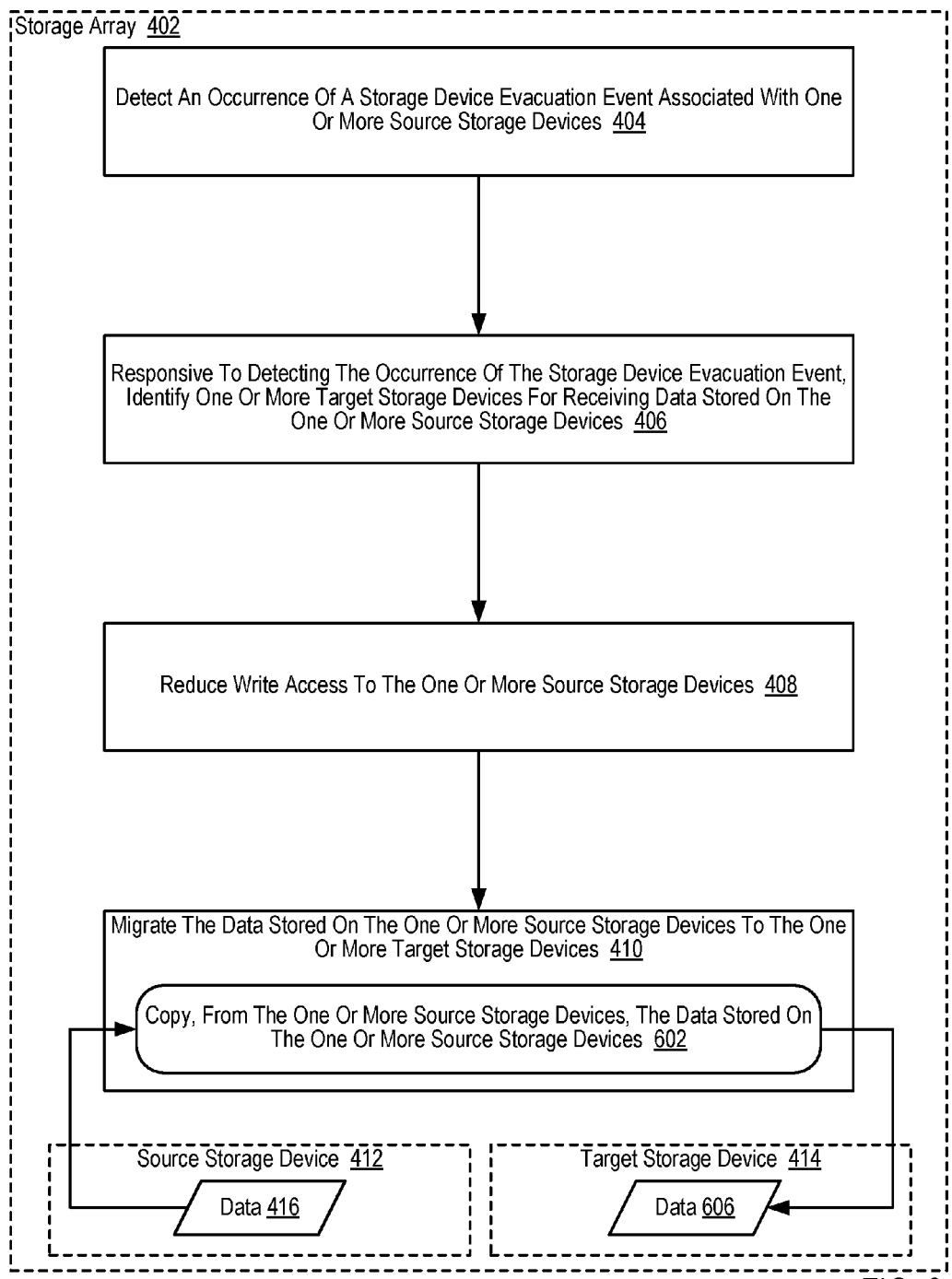
FIG. 6 sets forth a flow chart illustrating an additional example method for migrating data in a storage array that includes a plurality of storage devices according to embodiments of the present disclosure.

For further explanation, FIG. 6 sets forth a flow chart illustrating an additional example method for migrating data in a storage array that includes a plurality of storage devices according to embodiments of the present disclosure. The example method depicted in FIG. 6 is similar to the example method depicted in FIG. 4, as the example method depicted in FIG. 6 also includes detecting (404) an occurrence of a storage device evacuation event associated with one or more source storage devices (412), identifying (406) one or more target storage devices (414) for receiving data (416) stored on the one or more source storage devices (412), reducing (408) write access to the one or more source storage devices (412), and migrating (410) the data (416) stored on the one or more source storage devices (412) to the one or more target storage devices (414).

In the example method depicted in FIG. 6, migrating (410) the data (416) stored on the one or more source storage devices (412) to the one or more target storage devices (414) can include copying (602), from the one or more source storage devices (412) to the one or more target storage devices (414), the data (416) stored on the one or more source storage devices (412). Copying (602) the data (416) stored on the one or more source storage devices (412) from the one or more source storage devices (412) to the one or more target storage devices (414) may be carried out, for example, by the storage array controller reading the data (416) stored on the one or more source storage devices (412) and the storage array controller writing such data to the one or more target storage devices (414). In alternative embodiment, the storage array controller or even the drives themselves may be configured to support a copy operation that takes an identification of a source and an identification of a target as operands. In such an example, the operands may be specified as a range of physical addresses, a range of virtual addresses, a base address and an indication of the size of the data that is to be copied, an identification of a logical grouping of data such as a volume, and so on. Readers will appreciate that the example method depicted in FIG. 6 illustrates an embodiment where data (606) has been copied to the one or more target storage devices (414).

Figure 7:
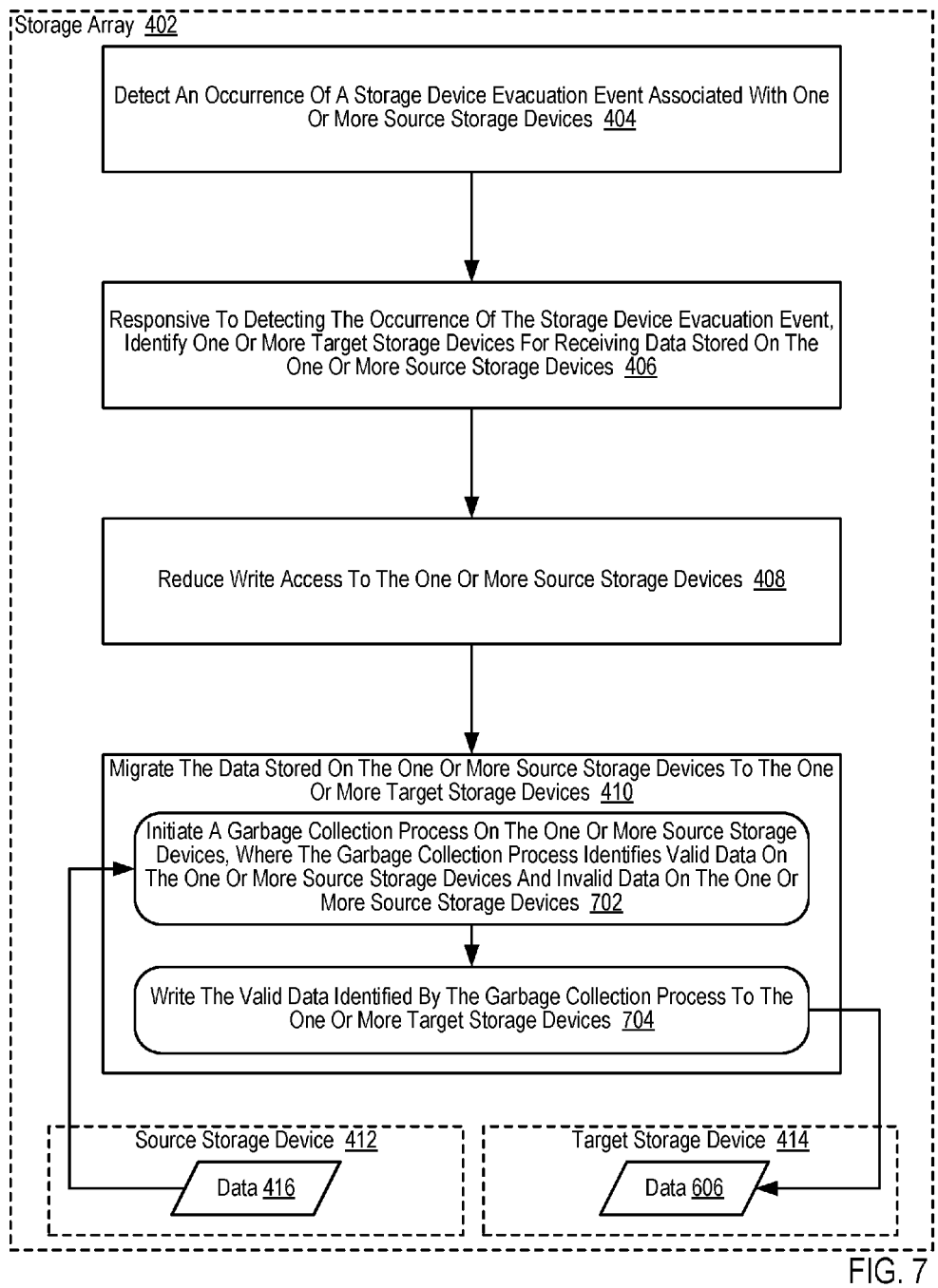
FIG. 7 sets forth a flow chart illustrating an additional example method for migrating data in a storage array that includes a plurality of storage devices according to embodiments of the present disclosure.

For further explanation, FIG. 7 sets forth a flow chart illustrating an additional example method for migrating data in a storage array that includes a plurality of storage devices according to embodiments of the present disclosure. The example method depicted in FIG. 7 is similar to the example method depicted in FIG. 4, as the example method depicted in FIG. 7 also includes detecting (404) an occurrence of a storage device evacuation event associated with one or more source storage devices (412), identifying (406) one or more target storage devices (414) for receiving data (416) stored on the one or more source storage devices (412), reducing (408) write access to the one or more source storage devices (412), and migrating (410) the data (416) stored on the one or more source storage devices (412) to the one or more target storage devices (414).

In the example method depicted in FIG. 7, migrating (410) the data (416) stored on the one or more source storage devices (412) to the one or more target storage devices (414) can include initiating (702) a garbage collection process on the one or more source storage devices (412). A garbage collection process may be embodied, for example, as a module of computer program instructions executing on computer hardware such as a computer processor or a microcontroller. The garbage collection process may be configured to reclaim memory that is occupied by data that is no longer in use. As described above, data that is no longer in use may be referred to herein as invalid data whereas data that is still in use may be referred to herein as valid data.

In the example method depicted in FIG. 7, the garbage collection process may identify valid data on the one or more source storage devices (412) and the garbage collection process can also identify invalid data on the one or more source storage devices (412). The garbage collection process may identify valid data on the one or more source storage devices (412) and the garbage collection process can also identify invalid data on the one or more source storage devices (412), for example, by reading metadata that is associated with data stored in the storage array (402). Such metadata can include information that can be used to determine whether a particular piece of data is valid or invalid. The metadata may include such information as the result of steps carried out by the storage array controller or the storage devices (412, 414) themselves when data is written to the storage devices (412, 414).

Consider an example in which the storage devices (412, 414) are embodied as SSDs where data is written to the SSDs in 16 KB pages. Attached to each page in the SSD may be a small amount (e.g., 8 Bytes) of additional memory that is used to store metadata associated with the page. The SSDs may be configured to receive requests to write data from the storage array controller, where the requests to write data include a virtual address that the SSD subsequently translates into a physical address. In such an example, the virtual-to-physical address translations may be stored by the SSD in a translation table that is maintained by the SSD. When the SSD receives a request to write data to a particular virtual address, the SSD may write the data to a first page that is associated with a first physical address and the SSD may also set a predetermined bit in the small amount of additional memory that is used to store metadata associated with the first page to a value indicating that the data contained therein is valid. If the SSD subsequently receives a second request to write data to the particular virtual address, the SSD may write the data to a second page that is described by a second physical address and also set a predetermined bit in the small amount of additional memory that is used to store metadata associated with the second page to a value indicating that the data contained therein is valid. In addition, the SSD may set the predetermined bit in the small amount of additional memory that is used to store metadata associated with the first page to a value indicating that the data contained therein is invalid, while also updating the translation table to map the particular virtual address to the second physical address. In such a way, the garbage collection process may scan the metadata associated with each page to determine whether the contents of each page are valid or invalid. Readers will appreciate that in other embodiments, metadata that is associated with data stored in the storage array (402) may be stored and maintained in other ways.

In the example method depicted in FIG. 7, migrating (410) the data (416) stored on the one or more source storage devices (412) to the one or more target storage devices (414) can also include writing (704) the valid data identified by the garbage collection process to the one or more target storage devices (414). Writing (704) the valid data identified by the garbage collection process to the one or more target storage devices (414) may be carried out, for example, by a storage array controller issuing one or more instructions to write the valid data identified by the garbage collection process to the one or more target storage devices (414). In such an example, writing (704) the valid data identified by the garbage collection process to the one or more target storage devices (414) may even be part of the garbage collection process as the garbage collection process can communicate with other modules on a storage array to facilitate writing (704) the valid data identified by the garbage collection process to the one or more target storage devices (414). Readers will appreciate that the example method depicted in FIG. 7 illustrates an embodiment where data (606) has been migrated to the one or more target storage devices (414) via the garbage collection process.

Figure 8:
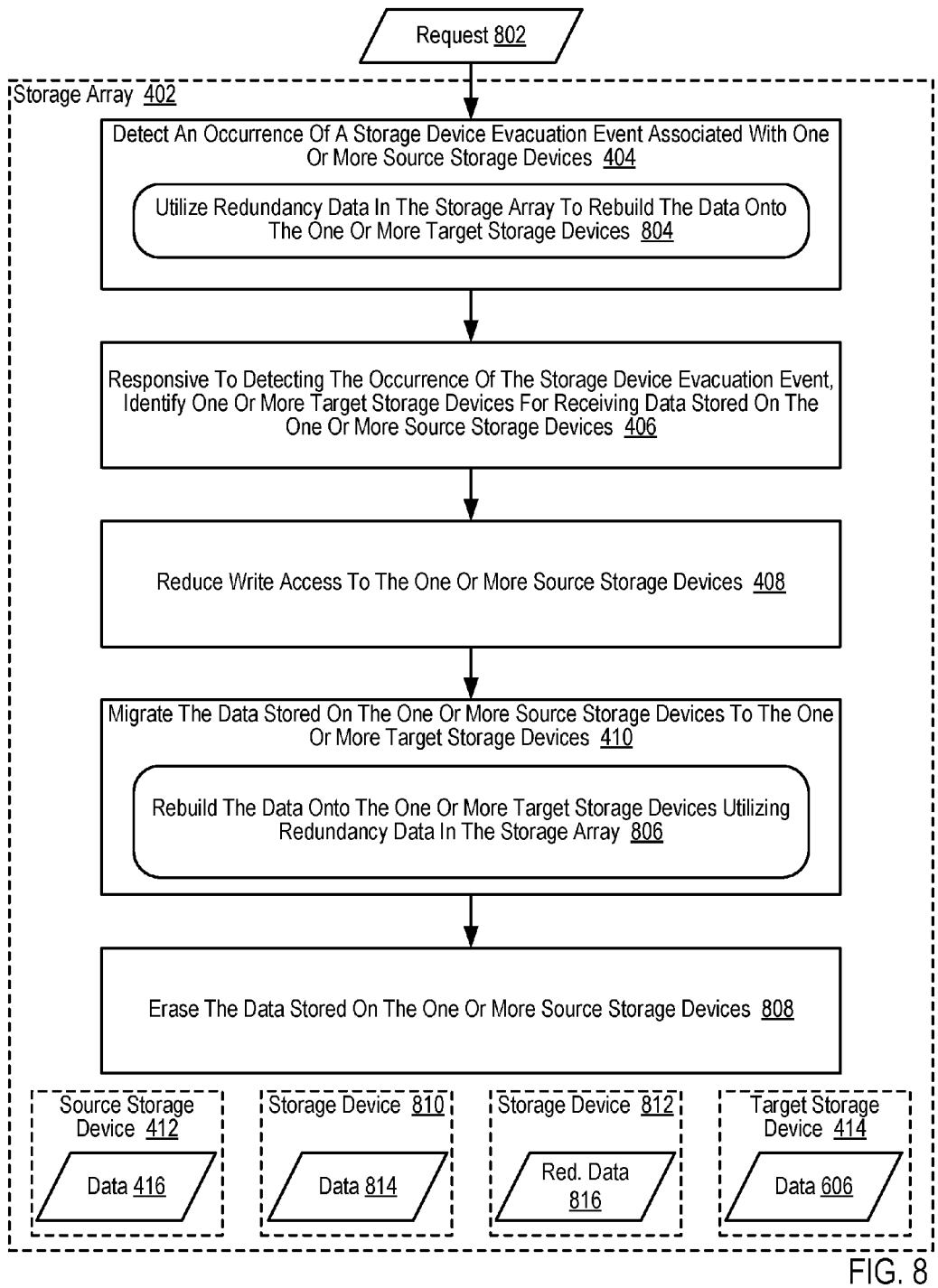
FIG. 8 sets forth a flow chart illustrating an additional example method for migrating data in a storage array that includes a plurality of storage devices according to embodiments of the present disclosure.

For further explanation, FIG. 8 sets forth a flow chart illustrating an additional example method for migrating data in a storage array that includes a plurality of storage devices according to embodiments of the present disclosure. The example method depicted in FIG. 8 is similar to the example method depicted in FIG. 4, as the example method depicted in FIG. 8 also includes detecting (404) an occurrence of a storage device evacuation event associated with one or more source storage devices (412), identifying (406) one or more target storage devices (414) for receiving data (416) stored on the one or more source storage devices (412), reducing (408) write access to the one or more source storage devices (412), and migrating (410) the data (416) stored on the one or more source storage devices (412) to the one or more target storage devices (414).

In the example method depicted in FIG. 8, detecting (404) an occurrence of a storage device evacuation event associated with one or more source storage devices (412) can include receiving (804) a user-initiated request (802) to migrate data away from the one or more source storage devices (412). The user-initiated request (802) to migrate data away from the one or more source storage devices (412) may be received (804), for example, through the use a user interface (e.g., a GUI presented on a display screen) that presents an inventory of the storage devices (412, 414) that are included in the storage array (402) and that also allows the user of the user interface to select one or more source storage devices (412) that are to be designated for removal from the storage array (402). Readers will appreciate that a user-initiated request (802) to migrate data away from the one or more source storage devices (412) may be received (804) in other ways in other embodiments.

In the example method depicted in FIG. 8, the data (416) that is stored on the one or more source storage devices (412) may be part of a data set that is striped across a plurality of storage devices. For example, the data (416) that is stored on the one or more source storage devices (412) may be part of a RAID stripe where data (814) that is stored on another storage device (810) is part of the RAID stripe. In such an example, redundancy data (816) may be stored on another storage device (812) in the storage array (402). Such redundancy data (816) may be used to rebuild data (416, 814) in the RAID stripe in the event that one of the storage devices (412, 810) that contain the data (416, 814) fails or otherwise becomes unavailable.

In the example method depicted in FIG. 8, migrating (410) the data (416) stored on the one or more source storage devices (412) to the one or more target storage devices (414) can include rebuilding (806) the data (416) onto the one or more target storage devices (414) utilizing redundancy data (816) in the storage array (402). Rebuilding (806) the data (416) onto the one or more target storage devices (414) may be carried out, for example, by utilizing RAID algorithms and the redundancy data (816) to rebuild the data (416) that is stored on the one or more source storage devices (412). In the example method depicted in FIG. 8, however, the one or more target storage devices (414) may be identified as the destination where the data rebuilt data will be stored.

The example method depicted in FIG. 8 also includes erasing (808) the data (416) stored on the one or more source storage devices (412). Erasing (808) the data (416) stored on the one or more source storage devices (412) may be carried out once the data (416) stored on the one or more source storage devices (412) has been successfully migrated to the one or more target storage devices (414). Erasing (808) the data (416) stored on the one or more source storage devices (412) may be carried out as a data protection measure, to ensure that once the storage devices (412) have been removed from the storage array (402), client data that resides on those storage devices (412) will not be accessed. Readers will appreciate that the example method depicted in FIG. 8 illustrates an embodiment where data (606) has been rebuilt onto the one or more target storage devices (414).

Readers will appreciate that although the example methods described above are depicted in a way where a series of steps occurs in a particular order, no particular ordering of the steps is required unless explicitly stated. Example embodiments of the present invention are described largely in the context of a fully functional computer system for migrating data in a storage array that includes a plurality of storage devices. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the example embodiments described in this specification are oriented to software installed and executing on computer hardware, nevertheless, alternative embodiments implemented as firmware or as hardware are well within the scope of the present invention.

The present invention may be embodied as an apparatus, a method, and/or a computer program product. The computer program product may include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, RAM, a read-only memory (ROM), an erasable programmable read-only memory (EPROM or Flash memory), a static random access memory (SRAM), a portable compact disc read-only memory (CD-ROM), a digital versatile disk (DVD), a memory stick, and so on. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a wide area network (WAN), or the connection may be made to an external computer (for example, through the Internet using an Internet Service Provider). In some embodiments, electronic circuitry including, for example, programmable logic circuitry, FPGAs, or PLAs may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of apparatuses, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Readers will appreciate that the steps described herein may be carried out in a variety ways and that no particular ordering is required. It will be further understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of migrating data in a storage array that includes a plurality of storage devices, the method comprising:

receiving, by the storage array, an indication that a properly functioning source storage device is designated for removal from the storage array;

in response to receiving the indication that the properly functioning source storage device is designated for removal from the storage array:

identifying, by the storage array, one or more target storage devices for receiving data stored on the properly functioning source storage device;

enabling read-write access to all deduplicated data stored within the properly functioning source storage device and enabling read-only access to the remaining portions of the properly functioning source storage device that do not contain deduplicated data;

allowing write requests to be performed on the deduplicated data stored on the properly functioning source storage device;

redirecting to the one or more target storage devices, any write requests for the remaining portions of the properly functioning source storage device; and migrating, by the storage array, the data stored on the properly functioning source storage device to the one or more target storage devices.

2. The method of claim 1 wherein migrating the data stored on the properly functioning source storage device to the one or more target storage devices further comprises copying, from the properly functioning source storage device to the target storage devices, the data stored on the properly functioning source storage device.

3. The method of claim 1 wherein migrating the data stored on the properly functioning source storage device to the one or more target storage devices further comprises:

initiating a garbage collection process on the properly functioning source storage device, wherein the garbage collection process identifies valid data on the properly functioning source storage device and invalid data on the properly functioning source storage device; and writing the valid data identified by the garbage collection process to the one or more target storage devices.

4. The method of claim 1 wherein migrating the data stored on the properly functioning source storage device to the one or more target storage devices further comprises rebuilding the data onto the one or more target storage devices utilizing redundancy data in the storage array.

5. The method of claim 1 further comprising erasing the data stored on the properly functioning source storage device.

6. The method of claim 1 wherein the data stored on the properly functioning source storage device is part of a data set that is striped across a plurality of storage devices.

7. An apparatus for migrating data in a storage array that includes a plurality of storage devices, the apparatus comprising a computer processor and a computer memory, the computer memory including computer program instructions that, when executed by the computer processor, cause the apparatus to carry out the steps of:

receiving, by the storage array, an indication that a properly functioning source storage device is designated for removal from the storage array;

in response to receiving the indication that the properly functioning source storage device is designated for removal from the storage array:

identifying one or more target storage devices for receiving data stored on the properly functioning source storage device;

enabling read-write access to all deduplicated data stored within the properly functioning source storage device and enabling read-only access to the remaining portions of the properly functioning source storage device that do not contain deduplicated data;

allowing write requests to be performed on the deduplicated data stored on the properly functioning source storage device;

redirecting to the one or more target storage devices, any write requests for the remaining portions of the properly functioning source storage device; and migrating the data stored on the properly functioning source storage device to the one or more target storage devices.

8. The apparatus of claim 7 wherein migrating the data stored on the properly functioning source storage device to the one or more target storage devices further comprises copying, from the properly functioning source storage device to the one or more target storage devices, the data stored on the properly functioning source storage device.

9. The apparatus of claim 7 wherein migrating the data stored on the properly functioning source storage device to the one or more target storage devices further comprises:

initiating a garbage collection process on the properly functioning source storage device, wherein the garbage collection process identifies valid data on the properly functioning source storage device and invalid data on the properly functioning source storage device; and writing the valid data identified by the garbage collection process to the one or more target storage devices.

10. The apparatus of claim 7 wherein migrating the data stored on the properly functioning source storage device to the one or more target storage devices further comprises rebuilding the data onto the one or more target storage devices utilizing redundancy data in the storage array.

11. The apparatus of claim 7 further comprising computer program instructions that, when executed by the computer processor, cause the apparatus to carry out the step of erasing the data stored on the properly functioning source storage device.

12. The apparatus of claim 7 wherein the data stored on the properly functioning source storage device is part of a data set that is striped across a plurality of storage devices.

13. A computer program product for migrating data in a storage array that includes a plurality of storage devices, the computer program product disposed on a computer readable storage medium, the computer program product including computer program instructions that, when executed by a computer processor, cause the computer processor to carry out the steps of:

receiving, by the storage array, an indication that a properly functioning source storage device is designated for removal from the storage array;

in response to receiving the indication that the properly functioning source storage device is designated for removal from the storage array:

identifying one or more target storage devices for receiving data stored on the source storage device;

enabling read-write access to all deduplicated data stored within the properly functioning source storage device and enabling read-only access to the remaining portions of the properly functioning source storage device that do not contain deduplicated data;

allowing write requests to be performed on the deduplicated data stored on the properly functioning source storage device;

redirecting to the one or more target storage devices, any write requests for the remaining portions of the properly functioning source storage device; and migrating the data stored on the properly functioning source storage device to the one or more target storage devices.

14. The method of claim 1 wherein the one or more target storage devices are mounted in a separate enclosure than the properly functioning source storage device.

* * * * *